United States Patent
Ajichi et al.

(10) Patent No.: US 10,317,728 B2
(45) Date of Patent: Jun. 11, 2019

(54) BACKLIGHT DEVICE AND LIQUID CRYSTAL DISPLAY DEVICE INCLUDING SAME

(71) Applicant: SHARP KABUSHIKI KAISHA, Sakai, Osaka (JP)

(72) Inventors: Yuhsaku Ajichi, Sakai (JP); Naoto Inoue, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 0 days.

(21) Appl. No.: 15/580,833

(22) PCT Filed: May 16, 2016

(86) PCT No.: PCT/JP2016/064430
§ 371 (c)(1),
(2) Date: Dec. 8, 2017

(87) PCT Pub. No.: WO2016/199544
PCT Pub. Date: Dec. 15, 2016

(65) Prior Publication Data
US 2018/0329258 A1  Nov. 15, 2018

(30) Foreign Application Priority Data
Jun. 8, 2015  (JP) ................. 2015-115491

(51) Int. Cl.
*G09G 3/20* (2006.01)
*G02F 1/1335* (2006.01)
(Continued)

(52) U.S. Cl.
CPC ..... *G02F 1/133603* (2013.01); *G09G 3/2003* (2013.01); *G09G 3/3426* (2013.01);
(Continued)

(58) Field of Classification Search
CPC .. G09G 3/2003; G09G 3/3406; G09G 3/3413; G09G 3/342; G09G 2320/0242; G02F 1/133603
See application file for complete search history.

(56) References Cited

U.S. PATENT DOCUMENTS

| | | |
|---|---|---|
| 2008/0024696 A1 | 1/2008 | Arai et al. |
| 2015/0116381 A1* | 4/2015 | Kim ............ G09G 3/3413 345/691 |
| 2016/0027404 A1* | 1/2016 | Nakanishi ........ G09G 5/02 345/590 |

FOREIGN PATENT DOCUMENTS

JP      2006-133721 A      5/2006

\* cited by examiner

*Primary Examiner* — Dennis P Joseph
(74) *Attorney, Agent, or Firm* — ScienBiziP, P.C.

(57) ABSTRACT

Object:
To provide a backlight device for a liquid crystal display device which can suppress occurrence of power loss in any of light emitting bodies, and a liquid crystal display device including the backlight device.
Solution to Problem:
In a cluster (161), arranged are two magenta light emitting bodies (131) including a blue light emitting element (143) with high drive voltage and red phosphors (151) covering the blue light emitting element (143), two green light emitting bodies (132), and one blue light emitting body (133). With this configuration, since two blue LED elements (143) are implemented also in two magenta light emitting bodies (131), the drive voltage of the magenta light emitting bodies (131) is substantially equal to the drive voltage of the green light emitting bodies (132) and the blue light emitting body (133).

19 Claims, 35 Drawing Sheets

(51) Int. Cl.
  *G09G 3/34*   (2006.01)
  *H01L 25/075*  (2006.01)
  *H05B 33/08*  (2006.01)
  G09G 3/36   (2006.01)
  G09G 3/32   (2016.01)
(52) U.S. Cl.
  CPC ..... *H01L 25/0753* (2013.01); *H05B 33/0803*
    (2013.01); *G09G 3/32* (2013.01); *G09G*
    *3/3607* (2013.01); *G09G 3/3648* (2013.01);
    *G09G 2310/0264* (2013.01); *G09G 2320/0242*
                  (2013.01)

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | BLUE | GREEN | BLUE |
| COLOR OF OUTPUT LIGHT FROM PHOSPHORS | RED | NONE | NONE |
| COLOR OF OUTPUT LIGHT FROM LIGHT EMITTING BODY | MAGENTA | GREEN | BLUE |

|  | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | BLUE | BLUE | BLUE |
| COLOR OF OUTPUT LIGHT FROM PHOSPHORS | RED | GREEN | NONE |
| COLOR OF OUTPUT LIGHT FROM LIGHT EMITTING BODY | MAGENTA | CYAN | BLUE |

|  | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | BLUE | GREEN | BLUE |
| COLOR OF OUTPUT LIGHT FROM PHOSPHORS | RED | NONE | GREEN |
| COLOR OF OUTPUT LIGHT FROM LIGHT EMITTING BODY | MAGENTA | GREEN | CYAN |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | BLUE | GREEN | BLUE |
| COLOR OF OUTPUT LIGHT FROM PHOSPHORS | RED | RED | NONE |
| COLOR OF OUTPUT LIGHT FROM LIGHT EMITTING BODY | MAGENTA | YELLOW | BLUE |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | BLUE | GREEN | BLUE |
| COLOR OF OUTPUT LIGHT FROM PHOSPHORS | RED | RED | GREEN |
| COLOR OF OUTPUT LIGHT FROM LIGHT EMITTING BODY | MAGENTA | YELLOW | CYAN |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | GREEN | GREEN | BLUE |
| COLOR OF OUTPUT LIGHT FROM PHOSPHORS | RED | NONE | NONE |
| COLOR OF OUTPUT LIGHT FROM LIGHT EMITTING BODY | YELLOW | GREEN | BLUE |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | GREEN | GREEN | BLUE |
| COLOR OF OUTPUT LIGHT FROM PHOSPHORS | RED | NONE | RED |
| COLOR OF OUTPUT LIGHT FROM LIGHT EMITTING BODY | YELLOW | GREEN | MAGENTA |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | GREEN | GREEN | BLUE |
| COLOR OF OUTPUT LIGHT FROM PHOSPHORS | RED | NONE | GREEN |
| COLOR OF OUTPUT LIGHT FROM LIGHT EMITTING BODY | YELLOW | GREEN | CYAN |

| | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | GREEN | BLUE | BLUE |
| COLOR OF OUTPUT LIGHT FROM PHOSPHORS | RED | GREEN | NONE |
| COLOR OF OUTPUT LIGHT FROM LIGHT EMITTING BODY | YELLOW | CYAN | BLUE |

|  | FIRST LIGHT EMITTING BODY | SECOND LIGHT EMITTING BODY | THIRD LIGHT EMITTING BODY |
|---|---|---|---|
| COLOR OF OUTPUT LIGHT FROM LIGHT EMITTING ELEMENT | GREEN | BLUE | BLUE |
| COLOR OF OUTPUT LIGHT FROM PHOSPHORS | RED | GREEN | RED |
| COLOR OF OUTPUT LIGHT FROM LIGHT EMITTING BODY | YELLOW | CYAN | MAGENTA |

| | | Light emitting element | Optical wavelength conversion material | Output light | Embodiment: The number of light emitting bodies | Embodiment: The number of elements | First Modification: The number of light emitting bodies | First Modification: The number of elements | Second Modification: The number of light emitting bodies | Second Modification: The number of elements | Third Modification: The number of light emitting bodies | Third Modification: The number of elements |
|---|---|---|---|---|---|---|---|---|---|---|---|---|
| First Embodiment (including modifications) | First light emitting body | BLUE | RED | MAGENTA | 2 | 1 | 2 | 1 | 1 | 2 | 2 | 1 |
| | Second light emitting body | GREEN | NONE | GREEN | 2 | 1 | 1 | 2 | 2 | 1 | 2 | 1 |
| | Third light emitting body | BLUE | NONE | BLUE | 1 | 2 | 1 | 2 | 1 | 2 | 2 | 1 |
| Second Embodiment (including modifications) | First light emitting body | BLUE | RED | MAGENTA | 2 | 1 | 1 | 2 | | | | |
| | Second light emitting body | BLUE | GREEN | CYAN | 2 | 1 | 2 | 1 | | | | |
| | Third light emitting body | BLUE | NONE | BLUE | 1 | 2 | 1 | 2 | | | | |
| Third Embodiment (including modifications) | First light emitting body | BLUE | RED | MAGENTA | 2 | 1 | 1 | 2 | | | | |
| | Second light emitting body | GREEN | NONE | GREEN | 1 | 2 | 1 | 2 | | | | |
| | Third light emitting body | BLUE | GREEN | CYAN | 2 | 1 | 2 | 1 | | | | |
| Fourth Embodiment | First light emitting body | BLUE | RED | MAGENTA | 2 | 1 | | | | | | |
| | Second light emitting body | GREEN | RED | YELLOW | 2 | 1 | | | | | | |
| | Third light emitting body | BLUE | NONE | BLUE | 1 | 2 | | | | | | |

FIG. 58

| | | | | EMBODIMENT | | FIRST MODIFICATION | | SECOND MODIFICATION | | THIRD MODIFICATION | |
|---|---|---|---|---|---|---|---|---|---|---|---|
| | | LIGHT EMITTING ELEMENT | OPTICAL WAVELENGTH CONVERSION MATERIAL | OUTPUT LIGHT | THE NUMBER OF LIGHT EMITTING BODIES | THE NUMBER OF ELEMENTS | THE NUMBER OF LIGHT EMITTING BODIES | THE NUMBER OF ELEMENTS | THE NUMBER OF LIGHT EMITTING BODIES | THE NUMBER OF ELEMENTS | THE NUMBER OF LIGHT EMITTING BODIES | THE NUMBER OF ELEMENTS |
| FIFTH EMBODIMENT | FIRST LIGHT EMITTING BODY | BLUE | RED | MAGENTA | 2 | 1 | | | | | | |
| | SECOND LIGHT EMITTING BODY | GREEN | RED | YELLOW | 2 | 1 | | | | | | |
| | THIRD LIGHT EMITTING BODY | BLUE | GREEN | CYAN | 1 | 2 | | | | | | |
| SIXTH EMBODIMENT | FIRST LIGHT EMITTING BODY | GREEN | RED | YELLOW | 2 | 1 | | | | | | |
| | SECOND LIGHT EMITTING BODY | GREEN | NONE | GREEN | 2 | 2 | | | | | | |
| | THIRD LIGHT EMITTING BODY | BLUE | NONE | BLUE | 1 | 1 | | | | | | |
| SEVENTH EMBODIMENT | FIRST LIGHT EMITTING BODY | GREEN | RED | YELLOW | 2 | 1 | | | | | | |
| | SECOND LIGHT EMITTING BODY | GREEN | NONE | GREEN | 2 | 2 | | | | | | |
| | THIRD LIGHT EMITTING BODY | BLUE | RED | MAGENTA | 1 | 1 | | | | | | |
| EIGHTH EMBODIMENT | FIRST LIGHT EMITTING BODY | GREEN | RED | YELLOW | 2 | 1 | | | | | | |
| | SECOND LIGHT EMITTING BODY | BLUE | GREEN | CYAN | 2 | 2 | | | | | | |
| | THIRD LIGHT EMITTING BODY | BLUE | NONE | BLUE | 1 | 2 | | | | | | |

FIG. 59

| | | OPTICAL WAVELENGTH CONVERSION MATERIAL | OUTPUT LIGHT | EMBODIMENT | | FIRST MODIFICATION | | SECOND MODIFICATION | | THIRD MODIFICATION | |
|---|---|---|---|---|---|---|---|---|---|---|---|
| | LIGHT EMITTING ELEMENT | | | THE NUMBER OF LIGHT EMITTING BODIES | THE NUMBER OF ELEMENTS | THE NUMBER OF LIGHT EMITTING BODIES | THE NUMBER OF ELEMENTS | THE NUMBER OF LIGHT EMITTING BODIES | THE NUMBER OF ELEMENTS | THE NUMBER OF LIGHT EMITTING BODIES | THE NUMBER OF ELEMENTS |
| NINTH EMBODIMENT | FIRST LIGHT EMITTING BODY | GREEN | RED | YELLOW | 2 | 1 | | | | | | |
| | SECOND LIGHT EMITTING BODY | BLUE | GREEN | CYAN | 2 | 1 | | | | | | |
| | THIRD LIGHT EMITTING BODY | BLUE | NONE | BLUE | 1 | 2 | | | | | | |
| TENTH EMBODIMENT | FIRST LIGHT EMITTING BODY | GREEN | RED | YELLOW | 2 | 1 | | | | | | |
| | SECOND LIGHT EMITTING BODY | BLUE | GREEN | CYAN | 2 | 1 | | | | | | |
| | THIRD LIGHT EMITTING BODY | BLUE | RED | MAGENTA | 1 | 2 | | | | | | |

FIG. 60

BACKLIGHT DEVICE AND LIQUID CRYSTAL DISPLAY DEVICE INCLUDING SAME

TECHNICAL FIELD

The present invention relates to a backlight device, and more specifically, to a backlight device for a liquid crystal display device which uses light emitting elements such as light emitting diodes (LEDs) as a light source.

BACKGROUND ART

Colors are displayed by additive color mixture of three primary colors in a liquid crystal display device denoting a color image. Accordingly, a liquid crystal display device of a transmission type requires a backlight device capable of irradiating white light including red light, green light, and blue light to a liquid crystal panel. In the related art, a cold cathode tube which is called a Cold Cathode Fluorescent Lamp (CCFL) has been adopted as a light source of the backlight device in many cases. In recent years, however, Light Emitting Diodes (LEDs) have been increasingly adopted from a viewpoint of low power consumption, facility of luminance control, or the like. Such LEDs include three types of LEDs that are a red LED emitting red light, a green LED emitting green light, and a blue LED emitting blue light. Note that, in general, devices in a state in which LED elements (LED chip) are implemented in a package and are covered with a lens are also called as "LEDs" in many cases. In this specification, however, to clearly distinguish from LED elements implemented within light emitting bodies, devices in this state are referred to as "light emitting bodies".

FIG. 61 is a diagram illustrating arrangement of light emitting bodies of respective colors in a backlight device in the related art, disclosed in PTL 1. As illustrated in FIG. 61, in the backlight device, a plurality of clusters 900A to 900C are arranged, each cluster being formed by seven light emitting bodies in total including two red light emitting bodies R emitting red light, three green light emitting bodies G emitting green light, and two blue light emitting bodies B emitting blue light. With this configuration, the backlight device can emit white light with color unevenness and luminance unevenness being suppressed.

CITATION LIST

Patent Literature

PTL 1: JP 2006-133721 A

SUMMARY OF INVENTION

Technical Problem

FIG. 62 is a block diagram illustrating a configuration of a drive voltage applying circuit which applies drive voltage to first light emitting bodies 930$p$ and second light emitting bodies 930$q$ in a backlight device in the related art. As illustrated in FIG. 62, the drive voltage applying circuit includes a power source, a plurality of first light emitting bodies 930$p$ and second light emitting bodies 930$q$, a constant current drive circuit 11, and transistors 12$p$ and 12$q$. Between the power source 10 and ground terminals, a plurality of first light emitting bodies 930$p$ or a plurality of second light emitting bodies 930$q$ are connected in series, and light emitting bodies thus connected are further connected in parallel. The currents Ip and Iq which flow through the first light emitting bodies 930$p$ and the second light emitting bodies 930$q$, respectively, are controlled to be a steady value by the constant current drive circuit 11 and the transistors 12$p$ and 12$q$. Drive voltage of the first light emitting bodies 930$p$ is denoted by Vp, and drive voltage of the second light emitting bodies 930$q$ is denoted by Vq. In this state, for example, when the drive voltage Vp of the first light emitting bodies 930$p$ is higher than the drive voltage Vq of the second light emitting bodies 930$q$, and the drive voltage Vp is applied to the first light emitting bodies 930$p$ and the second light emitting bodies 930$q$ from the power source 10, power loss does not occur in the first light emitting bodies 930$p$, but power loss indicated by Equation (1) below occurs in the second light emitting bodies 930$q$.

$$\text{Power Loss} = (Vp - Vq) \times I2 \qquad (1)$$

A red LED element is manufactured using InGaAlP in many cases, and the drive voltage in the case is about 2 V. A green LED element and a blue LED element are manufactured using GaN in many cases, and the drive voltage in this case is about 3 V. In this way, the drive voltage of the red LED element is lower than the drive voltage of the green and blue LED elements. Therefore, in the backlight device using a blue light emitting body or a green light emitting body as each first light emitting body 930$p$ illustrated in FIG. 62 and using a red light emitting body as each second light emitting body 930$q$, the power loss indicated by Equation (1) above occurs in the red light emitting body since the drive voltage of the red light emitting body is lower than the drive voltage of the green and blue light emitting bodies.

In the backlight device disclosed in PTL 1, a plurality of clusters 900A to 900C are arranged, each cluster being a fundamental unit and configured by seven light emitting bodies in total including two red light emitting bodies R, three green light emitting bodies G, and two blue light emitting bodies B. Therefore, whatever combinations of the light emitting bodies of respective colors are taken, drive voltages are different from each other for the light emitting bodies of respective colors, and power loss occurs in the red light emitting bodies R and the blue light emitting bodies B which are few in numbers. In addition, in one cluster (for example, the cluster 900A), the light emitting bodies are arranged so that light emitting bodies of the same color are not adjacent to each other. However, near the boundaries between adjacent clusters, as indicated by arrows, a green light emitting body G1 of the cluster 900A is adjacent to a green light emitting body G2 of the cluster 900B, and a green light emitting body G2 of the cluster 900B is adjacent to a green light emitting body G3 of the cluster 900C. With this configuration, light emitted from the backlight device is light in which the green light is emphasized and color unevenness is easy to occur.

In view of above, the present invention has an object to provide a backlight device for a liquid crystal display device which can suppress occurrence of power loss in any of light emitting bodies, and a liquid crystal display device including the backlight device.

Solution to Problem

A first aspect is a backlight device using light emitting diode elements as a light source, the backlight device including:

a substrate with a plurality of sets of clusters arranged in the backlight device, each cluster including at least one first light emitting body for emitting light of a first color, one second light emitting body for emitting light of a second color, and one third light emitting body for emitting light of a third color; and a drive voltage applying circuit configured to apply drive voltage of the same value to the first light emitting body, the second light emitting body, and the third light emitting body, wherein the first light emitting body includes either a blue light emitting element or a green light emitting element, and a red wavelength conversion material excited by light emitted from either the blue light emitting element or the green light emitting element to emit red light, the second light emitting body includes either a green light emitting element, or a blue light emitting element and a green wavelength conversion material excited by light emitted from the blue light emitting element to emit green light, the third light emitting body includes a blue light emitting element, and a total number of the first light emitting body, the second light emitting body, and the third light emitting body included in each cluster is four to six, a number of blue light emitting elements or green light emitting elements included in the first light emitting body or first light emitting bodies, a number of green light emitting elements or blue light emitting elements included in the second light emitting body or second light emitting bodies, and a number of blue light emitting elements included in the third light emitting body or third light emitting bodies is two.

In a second aspect, based on the first aspect, the first light emitting body is a magenta light emitting body configured to emit magenta light and includes the blue light emitting element and the red wavelength conversion material, the second light emitting body is a green light emitting body configured to emit green light and includes the green light emitting element, the third light emitting body is a blue light emitting body configured to emit blue light, the total number of three kinds of light emitting bodies including the first light emitting body, the second light emitting body, and the third light emitting body arranged in the cluster is five, any one kind of the light emitting body among the three kinds includes one light emitting body in which two corresponding light emitting elements are implemented, the other two kinds of light emitting bodies each includes two light emitting bodies in each of which one light emitting element corresponding to each light emitting body is implemented, the light emitting body in which the two light emitting elements are implemented is arranged in the center of the cluster, and the light emitting bodies in each of which one light emitting element is implemented are arranged such that the light emitting bodies surround the light emitting body in which two light emitting elements are implemented and the same kind of light emitting bodies are not adjacent to each other.

In a third aspect, based on the second aspect, the light emitting body in which the two light emitting elements are implemented is the blue light emitting body in which two blue light emitting elements are implemented, the light emitting bodies in each of which one light emitting element is implemented includes two magenta light emitting bodies in each of which one blue light emitting element is implemented, and two green light emitting bodies in each of which one green light emitting element is implemented, and the blue light emitting body is arranged in the center of the cluster, and the magenta light emitting bodies and the green light emitting bodies are arranged such that the light emitting bodies surround the blue light emitting body and the same kind of light emitting bodies are not adjacent to each other in the cluster.

In a fourth aspect, based on the first aspect, the first light emitting body is a magenta light emitting body configured to emit magenta light and includes the blue light emitting element and the red wavelength conversion material, the second light emitting body is a green light emitting body configured to emit green light and includes the green light emitting element, the third light emitting body is a blue light emitting body configured to emit blue light, the total number of three kinds of light emitting bodies including the first light emitting body, the second light emitting body, and the third light emitting body arranged in the cluster is four, any one kind of light emitting body among the three kinds includes two light emitting bodies in each of which one corresponding light emitting element is implemented, the other two kinds of light emitting bodies each includes one light emitting body in which two light emitting elements corresponding to each light emitting body are implemented, and the first light emitting body, the second light emitting body, and the third light emitting body are arranged in the cluster such that the same kind of light emitting bodies are not adjacent to each other.

In a fifth aspect, based on the fourth aspect, the one kind of light emitting body is the two magenta light emitting bodies in each of which one blue light emitting element is implemented, the two kinds of light emitting bodies include one green light emitting body in which two green light emitting elements are implemented and one blue light emitting body in which two blue light emitting elements are implemented, and the first light emitting bodies, the second light emitting body, and the third light emitting body are arranged in the cluster such that the same kind of light emitting bodies are not adjacent to each other.

In a sixth aspect, based on the fourth aspect, the one kind of light emitting body is the two green light emitting bodies in each of which one green light emitting element is implemented, the two kinds of light emitting bodies include one magenta light emitting body in which two blue light emitting elements are implemented and one blue light emitting body in which two blue light emitting elements are implemented, and the first light emitting bodies, the second light emitting body, and the third light emitting body are arranged in the cluster such that the same kind of light emitting bodies are not adjacent to each other.

In a seventh aspect, based on the first aspect, the first light emitting body is a magenta light emitting body configured to emit magenta light and includes the blue light emitting element and the red wavelength conversion material, the second light emitting body is a green light emitting body configured to emit green light and includes the green light emitting element, the third light emitting body is a blue light emitting body configured to emit blue light, two first light emitting bodies, two second light emitting bodies, and two third light emitting bodies are arranged in the cluster, and each of the first light emitting bodies, the second light emitting bodies, and the third light emitting bodies are a light emitting body in which one light emitting element corresponding to each light emitting body is implemented.

In an eighth aspect, based on the first aspect, the first light emitting body is a magenta light emitting body configured to emit magenta light and includes the blue light emitting element and the red wavelength conversion material, the second light emitting body is a cyan light emitting body configured to emit cyan light and includes the blue light emitting element and the green wavelength conversion material, the third light emitting body is a blue light emitting body configured to emit blue light, the total number of three kinds of light emitting bodies including the first light emitting body, the second light emitting body, and the third light emitting body arranged in the cluster is five, any one kind of the light emitting body among the three kinds includes one light emitting body in which two corresponding light emitting elements are implemented, the other two kinds of light emitting bodies each includes two light emitting bodies in which one light emitting element corresponding to each light emitting body is implemented, the light emitting body in which the two light emitting elements are implemented is arranged in the center of the cluster, and the light emitting bodies in each of which one light emitting element is implemented are arranged such that the light emitting bodies surround the light emitting body in which two light emitting elements are implemented and the same kind of light emitting bodies are not adjacent to each other.

In a ninth aspect, based on the first aspect, the first light emitting body is a magenta light emitting body configured to emit magenta light and includes the blue color emitting element and the red wavelength conversion material, the second light emitting body is a cyan light emitting body configured to emit cyan light and includes the blue light emitting element and the green wavelength conversion material, the third light emitting body is a blue light emitting body configured to emit blue light, the total number of three kinds of light emitting bodies including the first light emitting body, the second light emitting body, and the third light emitting body arranged in the cluster is four, any one kind of the light emitting body among the three kinds includes two light emitting bodies in each of which one light emitting elements corresponding to the light emitting body is implemented, the other two kinds of light emitting bodies each includes one light emitting body in which two light emitting elements corresponding to each light emitting body are implemented, and the first light emitting body, the second light emitting body, and the third light emitting body are arranged in the cluster such that the same kind of light emitting bodies are not adjacent to each other.

In a tenth aspect, based on the first aspect, the first light emitting body is a magenta light emitting body configured to emit magenta light and includes the blue light emitting element and the red wavelength conversion material, the second light emitting body is a green light emitting body configured to emit green light and includes the green light emitting element and emitting green light, the third light emitting body is a cyan light emitting body configured to emit cyan light and further includes a green wavelength conversion material excited by light emitted from the blue light emitting element to emit green light, the total number of three kinds of light emitting bodies including the first light emitting body, the second light emitting body, and the third light emitting body arranged in the cluster is five, any one kind of the light emitting body among the three kinds includes two light emitting bodies in each of which one light emitting element corresponding to the light emitting body is implemented, the other two kinds of light emitting bodies each includes two light emitting bodies in each of which one light emitting element corresponding to each light emitting body is implemented, the light emitting body in which the two light emitting elements are implemented is arranged in the center of the cluster, and the light emitting bodies in each of which one light emitting element is implemented are arranged such that the light emitting bodies surround the light emitting body in which the two light emitting elements are implemented and the same kind of light emitting bodies are not adjacent to each other.

In an eleventh aspect, based on the first aspect, the first light emitting body is a magenta light emitting body configured to emit magenta light and includes the blue light emitting element and the red wavelength conversion material, the second light emitting body is a green light emitting body configured to emit green light and includes the green light emitting element, the third light emitting body is a cyan light emitting body configured to emit cyan light and further includes a green wavelength conversion material excited by light emitted from the blue light emitting element to emit green light, the total number of three kinds of light emitting bodies including the first light emitting body, the second light emitting body, and the third light emitting body arranged in the cluster is four, any one kind of the light emitting body among the three kinds includes two light emitting bodies in each of which one corresponding light emitting elements is implemented, the other two kinds of light emitting bodies each includes one light emitting body in which two light emitting elements corresponding to each light emitting body are implemented, and the first light emitting body, the second light emitting body, and the third light emitting body are arranged in the cluster such that the same kind of light emitting bodies are not adjacent to each other.

In a twelfth aspect, based on the first aspect, the first light emitting body is a magenta light emitting body configured to emit magenta light and includes the blue light emitting element and the red wavelength conversion material.

In a thirteenth aspect, based on the twelfth aspect, the second light emitting body is a yellow light emitting body configured to emit yellow light and includes the green light emitting element and a red wavelength conversion material excited by light emitted from the green light emitting element to emit red light.

In a fourteenth aspect, based on the first aspect, the first light emitting body is a yellow light emitting body configured to emit yellow light and includes the green light emitting element and a red wavelength conversion material excited by light emitted from the green light emitting element to emit red light.

In a fifteenth aspect, based on the fourteenth aspect, the third light emitting body is a magenta light emitting body configured to emit magenta light and further includes a red wavelength conversion material excited by light emitted from the blue light emitting element to emit red light.

In a sixteenth aspect, based on the first aspect, the total number of three kinds of light emitting bodies including the first light emitting body, the second light emitting body, and the third light emitting body arranged in the cluster is five, any one kind of the light emitting body among the three kinds includes two light emitting bodies in each of which one corresponding light emitting elements is implemented, the other two kinds of light emitting bodies each includes two light emitting bodies in each of which one light emitting element corresponding to each light emitting body is implemented, the light emitting body in which the two light emitting elements are implemented is arranged in the center of the cluster, and the light emitting bodies in each of which one light emitting element is implemented are arranged such that the light emitting bodies surround the light emitting body in which the two light emitting elements are implemented and the same kind of light emitting bodies are not adjacent to each other.

In a seventeenth aspect, based on the first aspect the total number of three kinds of light emitting bodies including the first light emitting body, the second light emitting body, and the third light emitting body arranged in the cluster is four, any one kind of the light emitting body among the three kinds includes two light emitting bodies in each of which one corresponding light emitting element is implemented, the other two kinds of light emitting bodies each includes one light emitting body in which one light emitting element corresponding to each light emitting body is implemented, and the first light emitting body, the second light emitting body, and the third light emitting body are arranged in the cluster such that the same kind of light emitting bodies are not adjacent to each other.

In an eighteenth aspect, based on the first aspect, two first light emitting bodies, two second light emitting bodies, and two third light emitting bodies are arranged in the cluster, each of the first light emitting bodies, the second light emitting bodies, and the third light emitting bodies is a light emitting body in which one corresponding light emitting element is implemented.

A nineteenth aspect is a liquid crystal display device including:

a liquid crystal panel including a display unit for displaying an image;

the backlight device according to claim 1 configured to irradiate light to a rear surface of the liquid crystal panel; and a drive voltage applying circuit configured to apply drive voltage of the same value to the first light emitting body, the second light emitting body, and the third light emitting body, the liquid crystal display device further comprising a backlight driving circuit configured to drive the backlight device.

Advantageous Effects of Invention

According to the first aspect of the present invention, a first light emitting body is configured by a blue light emitting element or green light emitting element with high drive voltage and a red wavelength conversion material covering the blue light emitting element or green light emitting element, instead of a first light emitting body in which a red light emitting element with low drive voltage is implemented. Therefore, drive voltage of the first light emitting body is substantially equal to the drive voltage of a second light emitting body and a third light emitting body in which a green light emitting body or a blue light emitting body is implemented. With this configuration, it is possible to suppress occurrence of power loss in any of the light emitting bodies.

According to the second aspect of the present invention, a total of five first to third light emitting bodies may be arranged in a cluster. Among the light emitting bodies, the first light emitting body is a magenta light emitting body that emits magenta color and includes a blue light emitting element and a red wavelength conversion material, and the same number of blue or green light emitting elements are included in each light emitting body. With this configuration, drive voltages of respective light emitting bodies are substantially the same, and therefore it is possible to suppress occurrence of power loss in any of light emitting bodies. Moreover, any one kind of the light emitting body includes one light emitting body in which two corresponding light emitting elements are implemented, and the other two kinds of light emitting bodies each includes two light emitting bodies in each of which one light emitting element corresponding to each light emitting body is implemented. Furthermore, the light emitting body in which the two light emitting elements are implemented is arranged in the center of the cluster, and the light emitting bodies in each of which one light emitting element is implemented are arranged so that the light emitting bodies surround the light emitting body in which two light emitting elements are implemented and the same kind of light emitting bodies are not adjacent to each other. With this configuration, occurrence of color unevenness of an image can be suppressed in any direction of a cluster.

According to the third aspect of the present invention, a blue light emitting body in which two blue light emitting elements are implemented is arranged in the center of a cluster, and two magenta light emitting bodies in each of which one blue light emitting element is implemented and two green light emitting elements in each of which one green light emitting element is implemented are arranged so that the light emitting bodies surround the blue light emitting body and the same kind of light emitting bodies are not adjacent to each other. With this configuration, an advantageous effect similar to the advantageous effect of the second aspect can be achieved.

According to the fourth aspect of the present invention, a total of four first to third light emitting bodies may be arranged in a cluster. Among the light emitting bodies, the first light emitting body is a magenta light emitting body that emits magenta color and includes a blue light emitting element and a red wavelength conversion material, and the same number of blue or green light emitting elements are included in each light emitting body. With this configuration, drive voltages of respective light emitting bodies are substantially the same, and therefore it is possible to suppress occurrence of power loss in any of light emitting bodies. Moreover, any one kind of light emitting body includes two light emitting bodies in each of which one corresponding light emitting element is implemented, and the other two kinds of light emitting bodies each includes one light emitting body in which two light emitting elements corresponding to each light emitting body are implemented. These four light emitting bodies are arranged to form an approximate square and in which the same kind of light emitting bodies are not adjacent to each other. With this configuration, occurrence of color unevenness of an image can be suppressed in any direction of the cluster.

According to the fifth aspect of the present invention, among the four light emitting bodies in total, one blue light emitting body in which two blue light emitting elements are implemented, two magenta light emitting bodies in each of which one blue light emitting element is implemented, and one green light emitting body in which one green light emitting element is implemented are arranged to form an approximate square in which the same kind of light emitting bodies are not adjacent to each other. With this configuration, the advantageous effect similar to the advantageous effect in the second aspect can be achieved.

According to the sixth aspect of the present invention, among the four total light emitting bodies, two green light emitting bodies in each of which one green light emitting element is implemented, one magenta light emitting body in which two blue light emitting elements are implemented, and one blue light emitting body in which two blue light emitting elements are implemented are arranged to form an approximate square in which the same kind of light emitting bodies are not adjacent to each other. With this configuration, an advantageous effect similar to the advantageous effect of the second aspect can be achieved.

According to the seventh aspect of the present invention, two first light emitting bodies, two second light emitting bodies, and two third light emitting bodies are arranged in a cluster, and one blue light emitting element or one green light emitting element is implemented in each of the light emitting bodies. With this configuration, each of the first to third light emitting bodies includes two blue or green light emitting elements, and therefore, drive voltages of the first to third light emitting bodies are substantially equal to each other. With this configuration, occurrence of power loss is suppressed in any of the light emitting bodies.

According to the eighth aspect of the present invention, a total of five first to third light emitting bodies may be arranged in a cluster. Among the light emitting bodies, a magenta light emitting body that emits magenta color and includes a blue light emitting element and a red wavelength conversion material is used as the first light emitting body, and a cyan light emitting body that emits cyan light and includes a blue light emitting element and a green wavelength conversion material is used as the second light emitting body, instead of a green light emitting body. With this configuration, an advantageous effect similar to the advantageous effect of the second aspect can be achieved.

According to the ninth aspect of the present invention, a total of four first to third light emitting bodies may be arranged in a cluster. Among the light emitting bodies, a magenta light emitting body that emits magenta color and includes a blue light emitting element and a red wavelength conversion material is used as the first light emitting body, and a cyan light emitting body that emits cyan light and includes a blue light emitting element and a green wavelength conversion material is used as the second light emitting body, instead of a green light emitting body. With this configuration, an advantageous effect similar to the advantageous effect of the fourth aspect can be achieved.

According to the tenth aspect of the present invention, a total of five first to third light emitting bodies may be arranged in a cluster. Among the light emitting bodies, a magenta light emitting body that emits magenta color and includes a blue light emitting element and a red wavelength conversion material is used as the first light emitting body, and a cyan light emitting body that emits cyan light and includes a blue light emitting element and a green wavelength conversion material is used as the third light emitting body, instead of a blue light emitting body. With this configuration, an advantageous effect similar to the advantageous effect of the second aspect can be achieved.

According to the eleventh aspect of the present invention, a total of four first to third light emitting bodies may be arranged in a cluster. Among the light emitting bodies, a magenta light emitting body that emits magenta color and includes a blue light emitting element and a red wavelength conversion material is used as the first light emitting body, and a cyan light emitting body that emits cyan light and includes a blue light emitting element and a green wavelength conversion material is used as the third light emitting body, instead of a blue light emitting body. With this configuration, an advantageous effect similar to the advantageous effect of the fourth aspect can be achieved.

According to the twelfth aspect of the present invention, a blue light emitting element with high drive voltage is implemented in the first light emitting body, and therefore, drive voltage of the first light emitting body is substantially equal to drive voltage of a second light emitting body and a third light emitting body in which a green light emitting body or a blue light emitting body is implemented. With this configuration, it is possible to suppress occurrence of power loss in any of the light emitting bodies.

According to the thirteenth aspect of the present invention, the second light emitting body is a yellow light emitting body including a green light emitting element and a red wavelength conversion material, and therefore, drive voltage of the second light emitting body is substantially equal to drive voltage of other light emitting bodies in which a blue or green light emitting body is implemented. With this configuration, it is possible to suppress occurrence of power loss in any of the light emitting bodies.

According to the fourteenth aspect of the present invention, the first light emitting body is a yellow light emitting body including a green light emitting element and a red wavelength conversion material, and therefore, drive voltage of the first light emitting body is substantially equal to drive voltage of other light emitting bodies in which a blue or green light emitting body is implemented. With this configuration, it is possible to suppress occurrence of power loss in any of the light emitting bodies.

According to the fifteenth aspect of the present invention, the third light emitting body is a magenta light emitting body including a blue light emitting element and a red wavelength conversion material, and therefore, drive voltage of the third light emitting body is substantially equal to drive voltage of other light emitting bodies in which a blue or green light emitting body is implemented. With this configuration, it is possible to suppress occurrence of power loss in any of the light emitting bodies.

According to the sixteenth aspect of the present invention, a total of five first to third light emitting bodies may be arranged in a cluster. Among the light emitting bodies, the light emitting body in which the two light emitting elements are implemented is arranged in the center of the cluster, and the light emitting bodies in each of which one light emitting element is implemented are arranged so that the light emitting bodies surround the light emitting body in which two light emitting elements are implemented and the same kind of light emitting bodies are not adjacent to each other.

With this configuration, occurrence of color unevenness of an image can be suppressed in any direction of the cluster.

According to the seventeenth aspect of the present invention, a total of four first to third light emitting bodies may be arranged in a cluster. These four light emitting bodies are arranged to form an approximate square in which the same kind of light emitting bodies are not adjacent to each other. With this configuration, occurrence of color unevenness of an image can be suppressed in any direction of the cluster.

According to the eighteenth aspect of the present invention, two first light emitting bodies, two second light emitting bodies, and two third light emitting bodies are arranged in a cluster, and one blue light emitting element or one green light emitting element is implemented in each of the light emitting bodies, With this configuration, each of the first to third light emitting bodies includes two blue or green light emitting elements, and therefore, drive voltages of the first to third light emitting bodies are substantially equal to each other. With this configuration, occurrence of power loss is suppressed in any of the light emitting bodies.

According to the nineteenth aspect of the present invention, a liquid crystal display device in which occurrence of power loss is suppressed in any of the light emitting bodies can be achieved.

BRIEF DESCRIPTION OF DRAWINGS

FIG. 58 is a diagram illustrating a summary of the above-described first to fourth embodiments.

FIG. 59 is a diagram following FIG. 58 and illustrating a summary of the above-described fifth to eighth embodiments.

FIG. 60 is a diagram following FIG. 59 and illustrating a summary of the above-described ninth and tenth embodiments.

DESCRIPTION OF EMBODIMENTS

1. Basic Consideration

Figure 1:
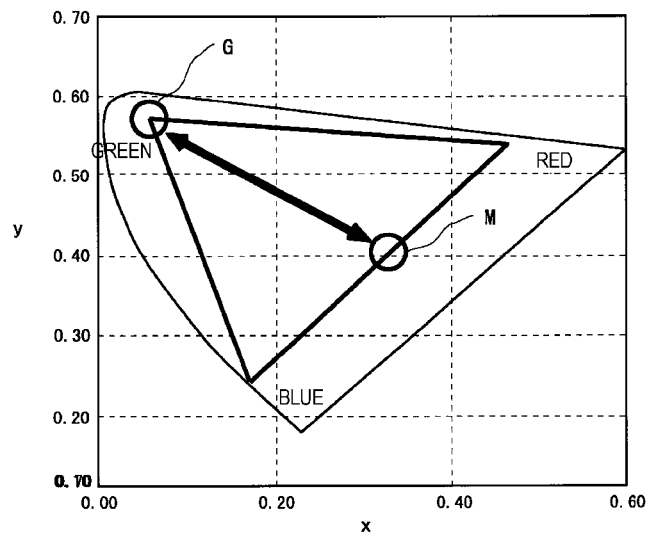
FIG. 1 is an xy chromaticity diagram which is used for basic consideration and illustrates a position of the color of the light emitted by a green light emitting body and a position of the color of the light emitted by a magenta light emitting body.

The drive voltage of red LED elements is lower than the drive voltage of green LED elements and blue LED elements, and therefore, power loss occurs in red light emitting bodies that include the red LED element. Here, in order to avoid such power loss, a magenta light emitting body is used instead of the red LED element with the low drive voltage. The magenta light emitting body includes a blue LED element and red phosphors excited by blue light emitted by the blue LED element to emit red light, and emits blue light and red light. By using the magenta light emitting body and a green light emitting body emitting green light in combination, light from the bodies are mixed to be white light. However, the following problem may occur in this case. FIG. 1 is an xy chromaticity diagram illustrating a position of the color of the light emitted by a green light emitting body G and a position of the color of the light emitted by a magenta light emitting body M. As illustrated in FIG. 1, the white balance adjustment of the backlight performed when two kinds of light emitting bodies of the magenta light emitting body M and the green light emitting body G are combined can be performed only on a line connecting the positions.

Figure 2:
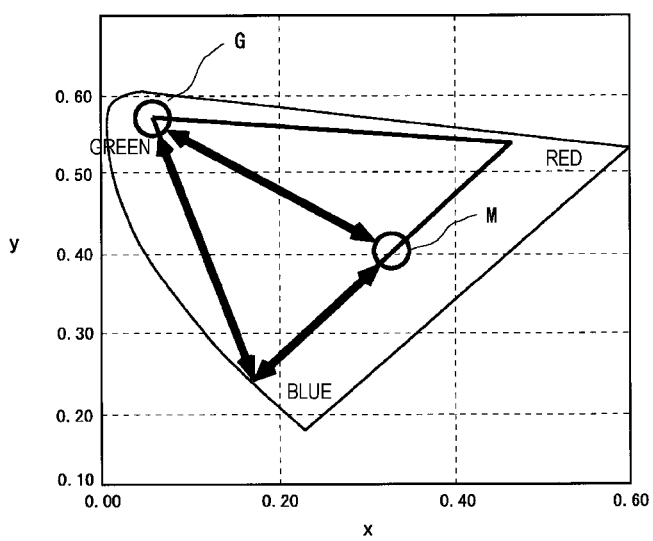
FIG. 2 is an xy chromaticity diagram which is used for basic consideration and illustrates a position of the color of the light emitted by the green light emitting body, a position of the color of the light emitted by the magenta light emitting body, and a position of the color of the light emitted by a blue light emitting body.

Therefore, three kinds of light emitting bodies are combined by further using a blue light emitting body B emitting blue light in addition to the magenta light emitting body M and the green light emitting body G. FIG. 2 is an xy chromaticity diagram illustrating the position of the color of the light emitted by the green light emitting body G, the position of the color of the light emitted by the magenta light emitting body M, and a position of the color of the light emitted by the blue light emitting body B. As illustrated in FIG. 2, the white balance of the backlight can be adjusted within a triangle formed by connecting respective positions of the colors of light emitted from the green light emitting body G, the magenta light emitting body M, and the blue light emitting body B. In this way, combining the three kinds of light emitting bodies expands the adjustable range of the white balance and increases flexibility of the adjustment. Furthermore, when the position of the color of the light emitted by the magenta light emitting body M is brought closer to the position of the red color, the adjustable range can be further expanded.

Therefore, in the present disclosure, embodiments are described below in which drive voltages of respective light emitting bodies are made the same or similar to each other in order to achieve reduction of power loss by combining three kinds of light emitting bodies.

2. First Embodiment

2.1 Overall Configuration and Operation

Figure 3:
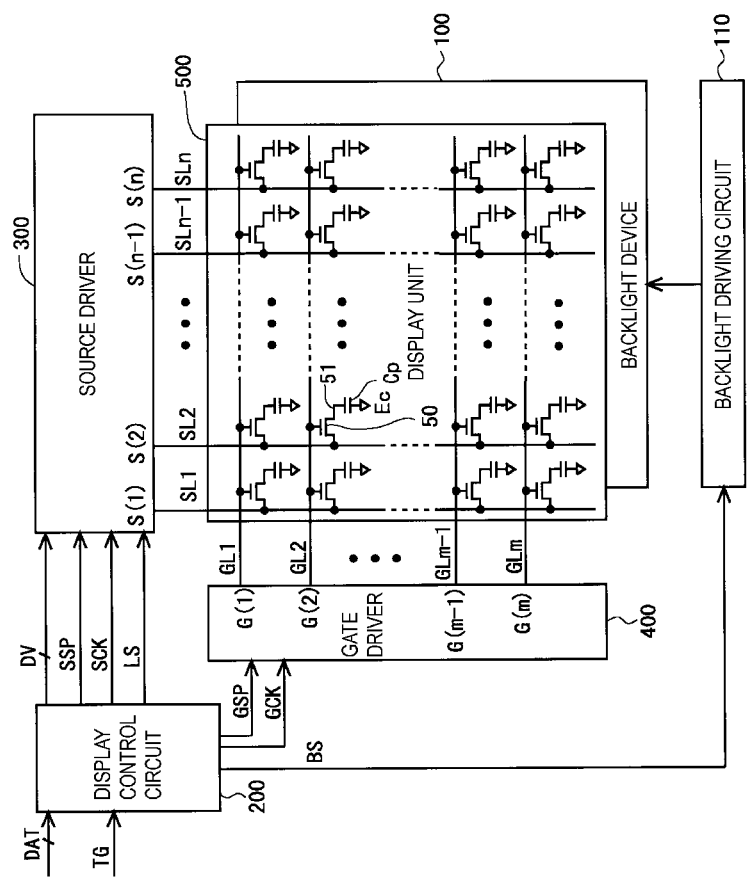
FIG. 3 is a block diagram illustrating an entire configuration of a liquid crystal display device including a backlight device according to a first embodiment of the present invention.

FIG. 3 is a block diagram illustrating an overall configuration of a liquid crystal display device including a backlight device 100 according to the first embodiment of the invention. The liquid crystal display device includes the backlight device 100, a backlight driving circuit 110, a display control circuit 200, a source driver (image signal line driving circuit) 300, a gate driver (scanning signal line driving circuit) 400, and a display unit 500.

The display unit 500 includes a plurality of (n) source bus lines (image signal lines) SL1 to SLn, a plurality of (m) gate bus lines (scanning signal lines) GL1 to GLm, and a plurality of (n×m) pixel forming parts provided so as to correspond to intersections of the plurality of source bus lines SL1 to SLn and the plurality of gate bus lines GL to GLm. The pixel forming parts are arranged in a matrix, and constitute a pixel array. Each of the pixel forming parts includes a thin film transistor (TFT) 50 which is a switching element in which a gate terminal is connected to a gate bus line passing through a corresponding intersection and a source terminal of which is connected to a source bus line passing through the intersection, a pixel electrode 51 which is connected to a drain terminal of the thin film transistor 50, a common electrode Ec which faces the pixel electrode 51 and is provided commonly to the plurality of pixel forming parts, and a liquid crystal layer (not illustrated) which is provided commonly to the plurality of pixel forming parts and held between the pixel electrode 51 and the common electrode Ec. A pixel capacity Cp is constituted by a liquid crystal capacity formed by the pixel electrode 51 and the common electrode Ec. Note that, in order to reliably maintain a voltage in the pixel capacity Cp, an auxiliary capacity is generally provided in parallel with the liquid crystal capacity. However, as the auxiliary capacity is not directly related to the present invention, description and illustration thereof will be omitted.

The backlight device 100 is provided on a rear surface side of a liquid crystal panel including the display unit 500, and irradiates backlight to a rear surface of the liquid crystal panel. On the backlight device 100, red, green and blue light emitting bodies are mounted as light sources. Note that a detailed configuration of the backlight device 100 will be described below.

The display control circuit 200 receives an image signal DAT transmitted from outside and a timing signal group TG of a horizontal synchronizing signal, a vertical synchronizing signal, and the like, and outputs digital image signals DV, a source start pulse signal SSP, a source clock signal SCK, and a latch strobe signal LS for controlling an operation of the source driver 300; a gate start pulse signal GSP and a gate clock signal GCK which are for controlling an operation of the gate driver 400; and a backlight control signal BS which is for controlling an operation of the backlight driving circuit 110.

The source driver 300 receives the digital image signals DV, the source start pulse signal SSP, the source clock signal SCK, and the latch strobe signal LS, which are transmitted from the display control circuit 200, and applies image signals for driving S(1) to S(n) to the source bus lines SL to SLn. At this time, in the source driver 300, the digital image signals DV each of which indicates voltage to be applied to each of the source bus lines SL1 to SLn are maintained successively at the time when a pulse of the source clock signal SCK is generated. Then, at the time when a pulse of the latch strobe signal LS is generated, the maintained digital image signals DV are converted into analogue voltages. The converted analogue voltages are simultaneously applied to all of the source bus lines SL1 to SLn as the image signals for driving S(1) to S(n).

On the basis of the gate start pulse signal GSP and the gate clock signal GCK which are transmitted from the display control circuit 200, the gate driver 400 repeatedly applies active scanning signals G(1) to G(m) to the gate bus lines GL1 to GLm, respectively, with one vertical scanning period as a cycle.

The backlight driving circuit 110 controls luminance of the LED elements implemented in each light emitting body mounted on the backlight device 100 on the basis of the backlight control signal BS transmitted from the display control circuit 200.

In such a manner, the scanning signals G(1) to G(m) are applied to the gate bus lines GL1 to GLm, respectively, the image signals for driving S(1) to S(n) are applied to the source bus lines SL to SLn, respectively, and the luminance of each light emitting body mounted on the backlight device 100 is controlled, and thereby an image according to the image signal DAT transmitted from the outside is displayed on the display unit 500.

2.2 Configuration of Backlight Device

Figure 4:
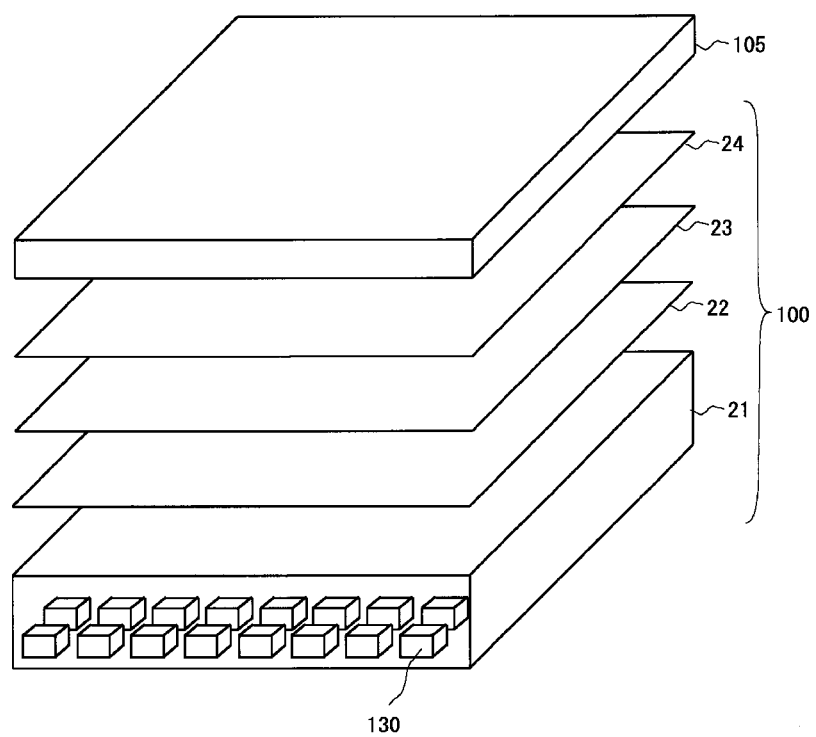
FIG. 4 is a perspective view illustrating a liquid crystal panel and a backlight device included in the liquid crystal display device illustrated in FIG. 3.

FIG. 4 is a perspective view illustrating a liquid crystal panel 105 and the backlight device 100. As illustrated in FIG. 4, the backlight device 100 of the direct type provided on the rear surface side of the liquid crystal panel 105 is used. In the backlight device 100, an LED substrate 21 on which a plurality of light emitting bodies 130 are implemented as the light source, a reflection sheet 22, a diffusion plate 23 by which light emitted from the light emitting bodies is diffused and made uniform, and an optical sheet 24 by which efficiency of light to be irradiated toward the liquid crystal panel 105 is improved are laminated in this order. The reflection sheet 22 is a sheet for reflecting the light reflected to the LED substrate 21 side by the diffusing plate 23 toward the liquid crystal panel 105, and is provided with openings (not illustrated) corresponding to positions of respective light emitting bodies 130 in order to transmit the light emitted from the light emitting bodies 130.

2.3 Configuration of Cluster

The backlight device 100 according to the present embodiment uses the magenta light emitting body including the red phosphors excited by blue light emitted by the blue LED element to emit red light instead of using a red light emitting body with low drive voltage, in order to make drive voltages for driving respective light emitting bodies substantially the same value.

Figures 5, 6:
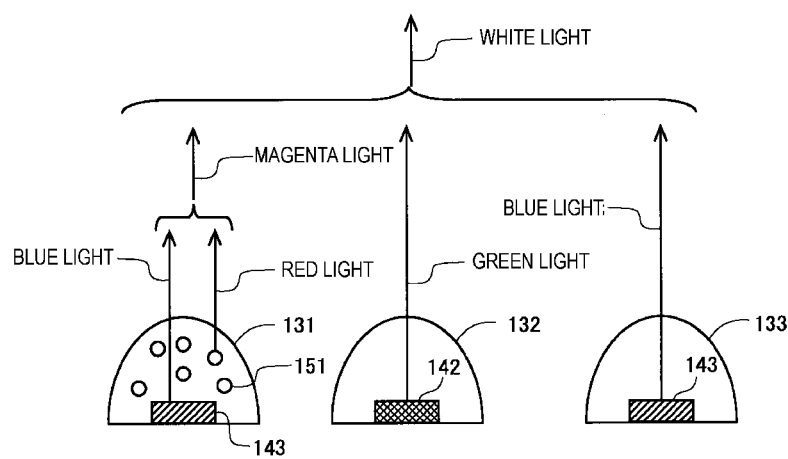
FIG. 5 is a diagram illustrating a structure of magenta, green and blue light emitting bodies, which are mounted on the backlight device according to a first embodiment of the present invention.
FIG. 6 is a diagram illustrating a summary of the relationship between the configuration of each of the light emitting bodies illustrated in FIG. 5 and the color of output light.

FIG. 5 is a diagram illustrating a structure of each of magenta, green and blue light emitting bodies 131, 132, and 133, which are mounted on the backlight device 100 according to the present embodiment. As illustrated in FIG. 5, blue light is emitted from each blue LED element 143, and green light is emitted from each green LED element 142. Therefore, the blue light emitting body 133 on which the blue LED element 143 is implemented emits blue light, and the green light emitting body 132 on which the green LED element 142 is implemented emits green light. Moreover, the magenta light emitting body 131 having the structure with red phosphors 151 covering the blue LED element 143 is used instead of a red light emitting body. In the magenta light emitting body 131, the red phosphors 151 are excited to a higher energy level by the blue light emitted from the blue LED element 143, and after that, emit red light at the time of transition to a lower energy level. Therefore, a part of the blue light emitted by the blue LED element 143 and the red light emitted by the red phosphors 151 are mixed, and the magenta light emitting body 131 emits magenta light. In this way, then the magenta light is emitted from the magenta light emitting body 131, the green light is emitted from the green light emitting body 132, and the blue light is emitted from the blue light emitting body 133, white light is generated by the mixture of the emitted light and irradiated to the liquid crystal panel 105. The following is a summary of the relationship between the configuration of each of the above-described light emitting bodies 131 to 133 and the color of the output light. FIG. 6 is a diagram illustrating a summary of the relationship between the configuration of each of the light emitting bodies 131 to 133 illustrated in FIG. 5 and the color of the output light. As illustrated in FIG. 6, the magenta light emitting body 131 serving as a first light emitting body emits the magenta light, the green light emitting body 132 serving as a second light emitting body emits the green light, and the blue light emitting body 133 serving as a third light emitting body emits the blue light.

Figure 7:
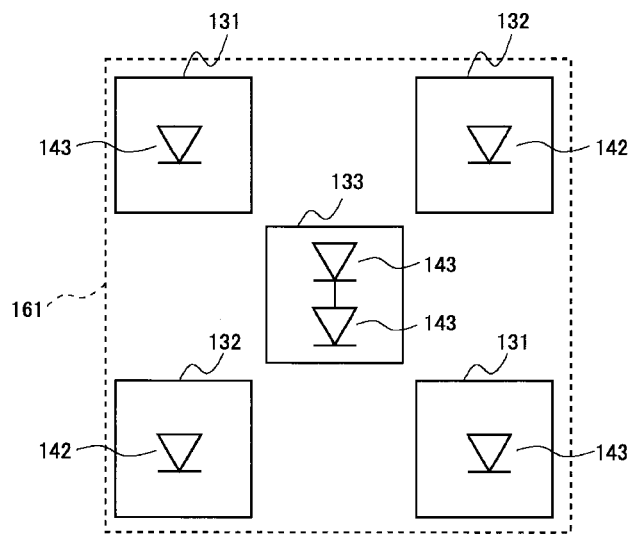
FIG. 7 is a diagram illustrating an arrangement of respective light emitting bodies in a cluster, and a number of green and blue LED elements implemented in respective light emitting bodies according to the first embodiment.

The magenta light emitting bodies 131, the green light emitting bodies 132, and the blue light emitting bodies 133 are regularly arranged on the LED substrate 21 of the backlight device 100. The fundamental unit which configures this regular arrangement is called a cluster 161. FIG. 7 is a diagram illustrating arrangement of respective light emitting bodies 131 to 133 in the cluster 161, and the number of LED elements 142 and 143 implemented in respective light emitting bodies 131 to 133. As illustrated in FIG. 7, two magenta light emitting bodies 131 and two green light emitting bodies 132 are arranged in the cluster 161, and one blue light emitting body 133 is arranged in the cluster 161. Two blue LED elements 143 are implemented in a package of the blue light emitting body 133, one green LED element 142 is implemented in a package of each of two green light emitting bodies 132, and one blue LED element 143 is implemented in a package of each of two magenta light emitting bodies 131. The shape of the cluster 161 is a square shape with substantially the same lengths in horizontal and vertical directions, and two green light emitting bodies 132 and two magenta light emitting bodies 131 are arranged in different diagonal directions so that the light emitting bodies of the same color are not adjacent to each other at the circumference in the cluster 161. The blue light emitting body 133 is arranged in the center of the cluster 161 which is an area surrounded by the magenta and green light emitting bodies.

Figure 8:
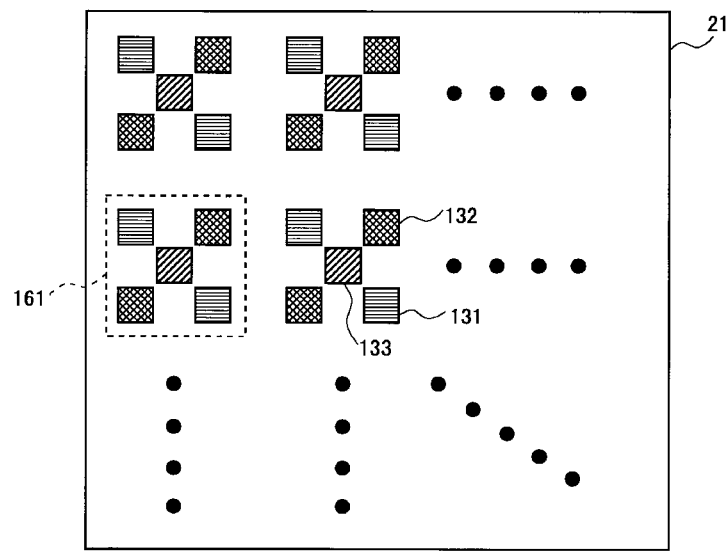
FIG. 8 is a diagram illustrating an arrangement of clusters on the LED substrate of the first embodiment.

FIG. 8 is a diagram illustrating arrangement of clusters 161 on the LED substrate 21 of the present embodiment. As illustrated in FIG. 8, respective clusters 161 are arranged regularly. Therefore, each green light emitting body 132 of each cluster 161 is adjacent to the magenta light emitting bodies 131 of neighboring clusters 161, and each magenta light emitting body 131 is adjacent to the green light emitting bodies 132 of neighboring clusters 161. With this configuration, the magenta light or the green light is not emphasized, such that occurrence of color unevenness can be suppressed. Furthermore, since the shape of each cluster 161 is a substantial square with high symmetry, the color unevenness of an image displayed on the liquid crystal panel 105 is suppressed in any direction.

Figure 9:
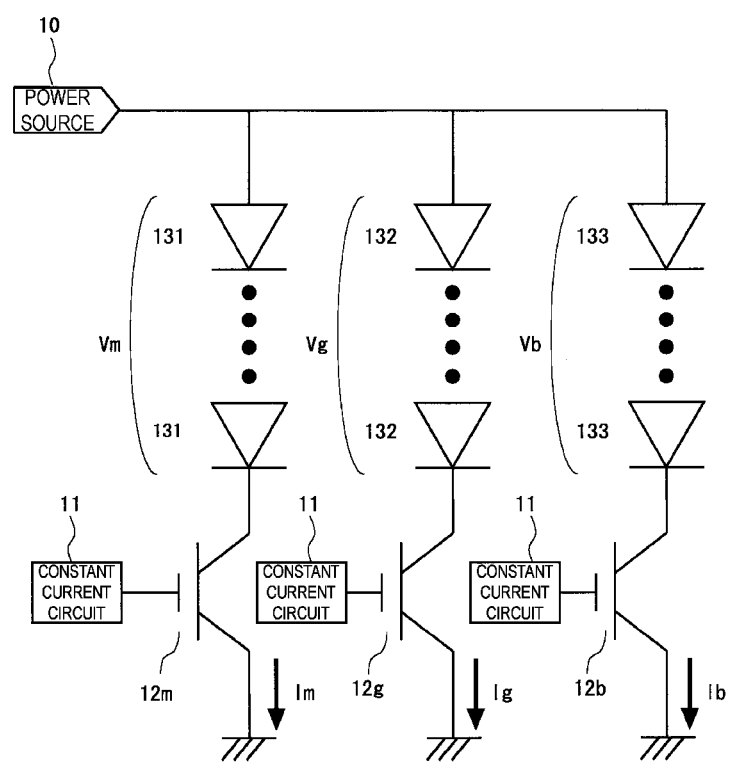
FIG. 9 is a block diagram illustrating a configuration of a drive voltage applying circuit which applies drive voltage to the respective light emitting bodies according to the first embodiment.

FIG. 9 is a block diagram illustrating a configuration of a drive voltage applying circuit which applies drive voltage to the magenta light emitting bodies 131, the green light emitting bodies 132, and the blue light emitting bodies 133. As illustrated in FIG. 9, the drive voltage applying circuit includes a power source 10, the plurality of magenta light emitting bodies 131, green light emitting bodies 132, blue light emitting bodies 133, a constant current drive circuit 11, and transistors 12m, 12g, and 12b. Between the power source 10 and ground terminals, the plurality of magenta light emitting bodies 131, the plurality of green light emitting bodies 132, and the plurality of blue light emitting bodies 133 are connected in series, and the light emitting bodies thus connected are further connected in parallel. The currents Im, Ig, and Ib which flow through the light emitting bodies 131 to 133, respectively, are controlled to be a steady value by the constant current drive circuit 11 and by the transistors 12m to 12b, respectively. With this configuration, the drive voltage of the magenta light emitting bodies 131 is substantially equal to the drive voltage of the green light emitting bodies 132 and the blue light emitting bodies 133. As a result, even when the same drive voltage is applied to each of the magenta light emitting bodies 131, the green light emitting bodies 132, and the blue light emitting bodies 133 by the drive voltage applying circuit, power loss does not occur in any of the magenta light emitting bodies 131.

2.4 Effect

The magenta light emitting body 131 including both the blue LED element 143 with high drive voltage and the red phosphors 151 covering the blue LED element 143 is used instead of a red light emitting body in which a red LED element with low drive voltage is implemented, and each of the clusters 161 is configured by two magenta light emitting bodies 131, two green light emitting bodies 132, and one blue light emitting body 133. Since the blue LED element 143 is implemented also in each of two magenta light emitting bodies 131, the drive voltage of the magenta light emitting bodies 131 is substantially equal to the drive voltage of the green light emitting bodies 132 and the blue light emitting body 133. As a result, power consumption of the magenta light emitting bodies 131 is substantially equal to the power consumption of the green light emitting bodies 132 and the blue light emitting body 133, and power loss does not occur in the magenta light emitting bodies 131.

Furthermore, since the magenta light emitting body 131 of the cluster 161 is adjacent to the green light emitting bodies 132 of the neighboring clusters 161, and the shape of each cluster 161 is a substantial square with high symmetry, occurrence of color unevenness of an image displayed on the liquid crystal panel 105 is suppressed in any direction.

2.5 Modifications

While clusters may be formed by the magenta light emitter 131, the green light emitter 132, and the blue light emitter 133 as in the above embodiment, cases in which the number or arrangement of the light emitting bodies 131 to 133 in the cluster differs from the above embodiment will be described below as the first to third modifications.

2.5.1 First Modification

Figure 10:
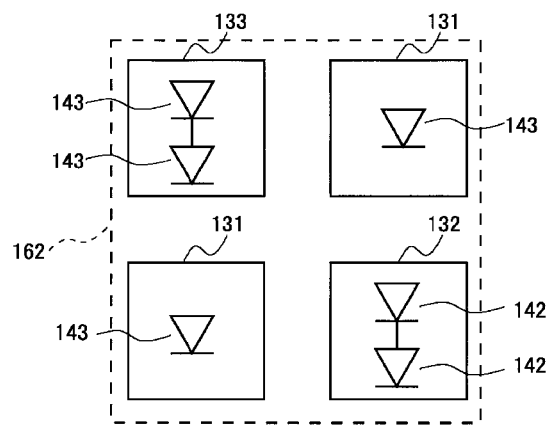
FIG. 10 is a diagram illustrating an arrangement of respective light emitting bodies in a cluster, and a number of green and blue LED elements implemented in respective light emitting bodies according to a first modification of the first embodiment.

FIG. 10 is a diagram illustrating an arrangement of respective light emitting bodies 131 to 133 in a cluster 162, and the number of LED elements 142 and 143 implemented in respective light emitting bodies 131 to 133 according to a first modification of the first embodiment. As illustrated in FIG. 10, two magenta light emitting bodies 131 are arranged in the cluster 162, and one green light emitting body 132 and one blue light emitting body 133 are arranged in the cluster 162. Two blue LED elements 143 are implemented in a package of the blue light emitting body 133, two green LED element 142 are implemented in a package of the green light emitting body 132, and one blue LED element 143 is implemented in a package of each of two magenta light emitting bodies 131. The shape of the cluster 162 is a square shape with substantially the same lengths in horizontal and vertical directions. Two magenta light emitting bodies 131 are arranged in a diagonal direction so that the light emitting bodies are not adjacent to each other around the circumference of the cluster 162, and the green light emitting body 132 and the blue light emitting body 133 are arranged adjacent to the magenta light emitting bodies 131 around the circumference in the cluster 162.

Figure 11:
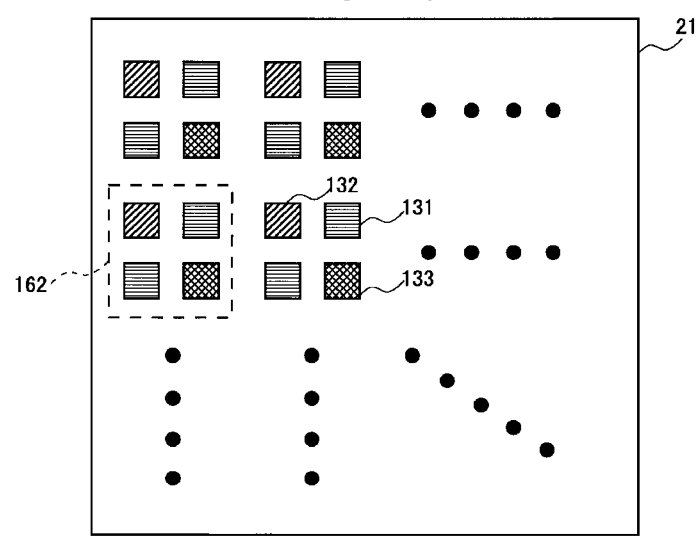
FIG. 11 is a diagram illustrating an arrangement of clusters on the LED substrate according to the first modification of the first embodiment.

FIG. 11 is a diagram illustrating an arrangement of clusters 162 on the LED substrate 21 according to the first modification of the present embodiment. As illustrated in FIG. 11, respective clusters 162 are arranged regularly. Therefore, each magenta light emitting body 131 of each cluster 162 is adjacent to the green light emitting body 132 or the blue light emitting body 133 of neighboring clusters 162. Note that the advantageous effect of the present modification is the same as the above-described embodiment, and therefore description thereof is omitted.

2.5.2 Second Modification

Figure 12:
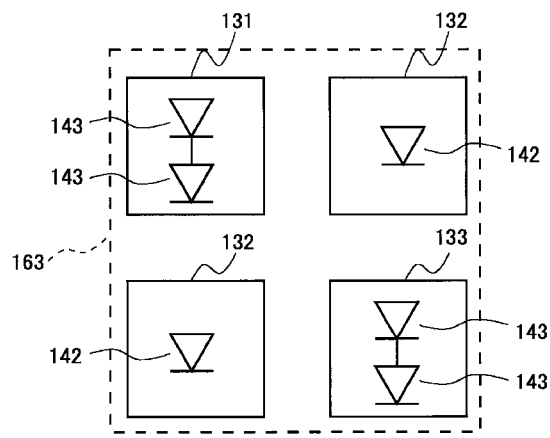
FIG. 12 is a diagram illustrating an arrangement of respective light emitting bodies in a cluster according to a second modification of the first embodiment, and the number of green and blue LED elements implemented in respective light emitting bodies.

FIG. 12 is a diagram illustrating an arrangement of respective light emitting bodies 131 to 133 in a cluster 163, and the number of LED elements 142 and 143 implemented in respective light emitting bodies 131 to 133 according to a second modification of the present embodiment. As illustrated in FIG. 12, two green light emitting bodies 132 are arranged in the cluster 163, and one magenta light emitting body 131 and one blue light emitting body 133 are arranged in the cluster 163. Two blue LED elements 143 are implemented in each of a package of the blue light emitting body 133 and a package of the magenta light emitting body 131, and one green LED element 142 is implemented in a package of each of two green light emitting bodies 132. The shape of the cluster 163 is a square shape with substantially the same lengths in horizontal and vertical directions. Two green light emitting bodies 132 are arranged in a diagonal direction so that the light emitting bodies are not adjacent to each other around the circumference in the cluster 163, and the magenta light emitting body 131 and the blue light emitting body 133 are arranged adjacent to the green light emitting bodies 132 around the circumference in the cluster 163.

Figure 13:
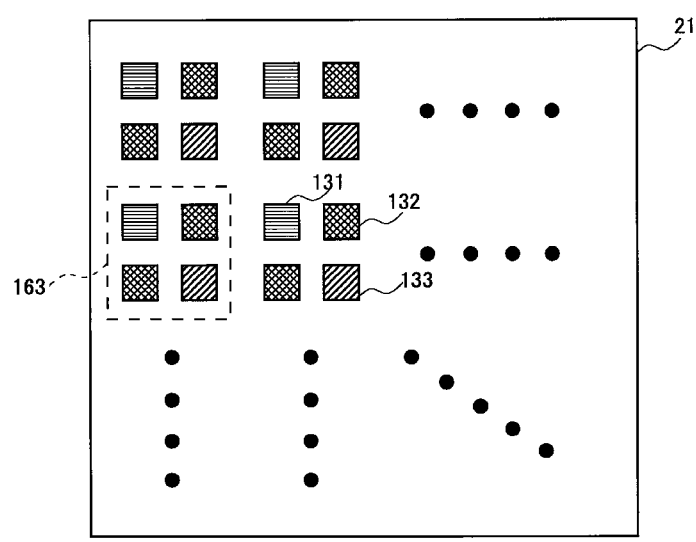
FIG. 13 is a diagram illustrating an arrangement of clusters on the LED substrate according to the second modification of the first embodiment.

FIG. 13 is a diagram illustrating an arrangement of clusters 163 on the LED substrate 21 according to the second modification of the present embodiment. As illustrated in FIG. 13, respective clusters 163 are arranged regularly. Therefore, each green light emitting body 132 of each cluster 163 is adjacent to the magenta light emitting body 131 or the blue light emitting body 133 of neighboring clusters 163. Note that the advantageous effect of the present modification is the same as the above-described embodiment, and therefore description thereof is omitted.

2.5.3 Third Modification

Figure 14:
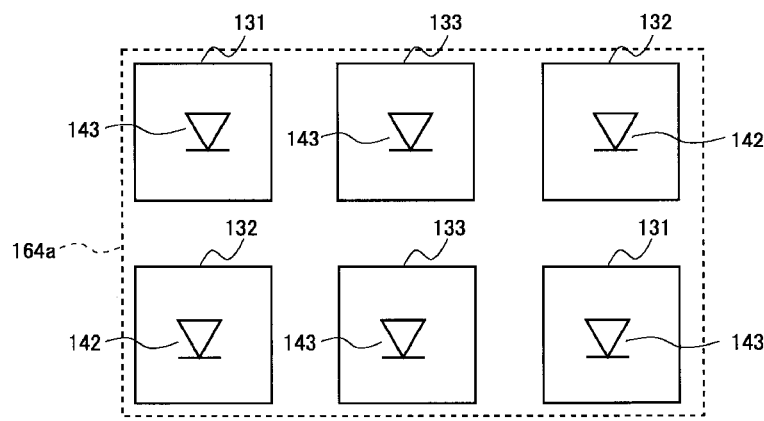
FIG. 14 is a diagram illustrating an arrangement of respective light emitting bodies in a cluster, and a number of green and blue LED elements implemented in respective light emitting bodies according to a third modification of the first embodiment.

FIG. 14 is a diagram illustrating an arrangement of respective light emitting bodies 131 to 133 in a cluster 164*a*, and the number of LED elements 142 and 143 implemented in respective light emitting bodies 131 to 133 according to a third modification of the present embodiment. As illustrated in FIG. 14, two magenta light emitting bodies 131, two blue light emitting bodies 133, and two green light emitting bodies 132 are arranged in the cluster 164*a*. One green LED element 142 is implemented in a package of each green light emitting body 132, and one blue LED element 143 is implemented in a package of each magenta light emitting body 131 and a package of each blue light emitting body 133. In this case, even when the same drive voltage is applied to each of the magenta light emitting bodies 131, the green light emitting bodies 132, and the blue light emitting bodies 133, power loss does not occur in any of the magenta light emitting bodies 131.

Figure 15:
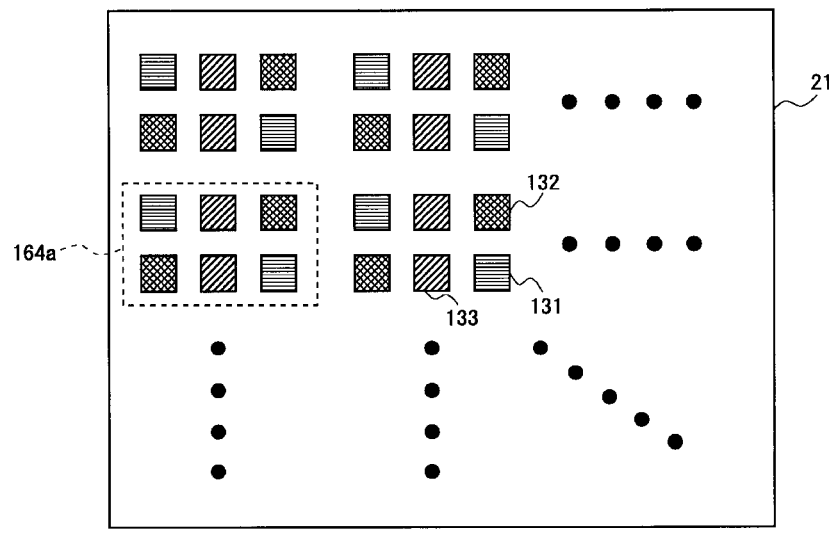
FIG. 15 is a diagram illustrating an arrangement of clusters on the LED substrate according to the third modification of the present embodiment.

FIG. 15 is a diagram illustrating an arrangement of clusters 164*a* on the LED substrate 21 according to the third modification of the present embodiment. As illustrated in FIG. 15, the shape of cluster 164*a* is a rectangle, the magenta light emitting body 131, the blue light emitting body 133, and the green light emitting body 132 are arranged in this order from the left on the upper row, and the green light emitting body 132, the blue light emitting body 133, and the magenta light emitting body 131 are arranged in this order from the left on the lower row. In this case, as the blue light emitting bodies 133 are located in a line in the vertical direction of FIG. 15 and are adjacent to each other, blue light is emphasized and color unevenness occurs in the vertical direction.

Figure 16:
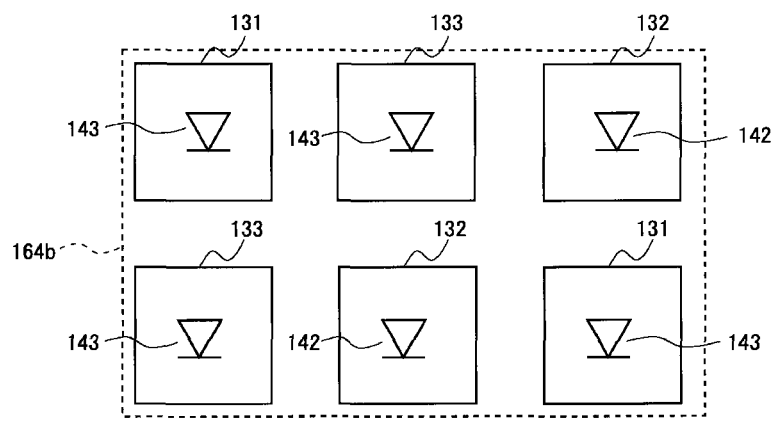
FIG. 16 is a diagram illustrating an arrangement of respective light emitting bodies in the cluster, a part of which is changed from the arrangement illustrated in FIG. 14.

Accordingly, a part of the arrangement of the light emitting bodies 131 to 133 in the cluster 164*a* is changed without changing the configuration of the light emitting bodies 131 to 133 and the number of the light emitting bodies 131 to 133. FIG. 16 is a diagram illustrating a cluster 164*b* in which a part arrangement of the light emitting bodies 131 to 133 is changed from the arrangement in the cluster 164*a* illustrated in FIG. 14. In the cluster 164*b* illustrated in FIG. 16, the green light emitting body 132 on the left and the blue light emitting body 133 in the center of the lower row are replaced, so that the blue light emitting body 133, the green light emitting body 132, and the magenta light emitting body 131 are arranged in this order from the left on the lower row. With this configuration, also in the cluster 164*b*, even when the same drive voltage is applied to each of the magenta light emitting bodies 131, the green light emitting bodies 132, and the blue light emitting bodies 133, power loss does not occur in any of the magenta light emitting bodies 131.

Figure 17:
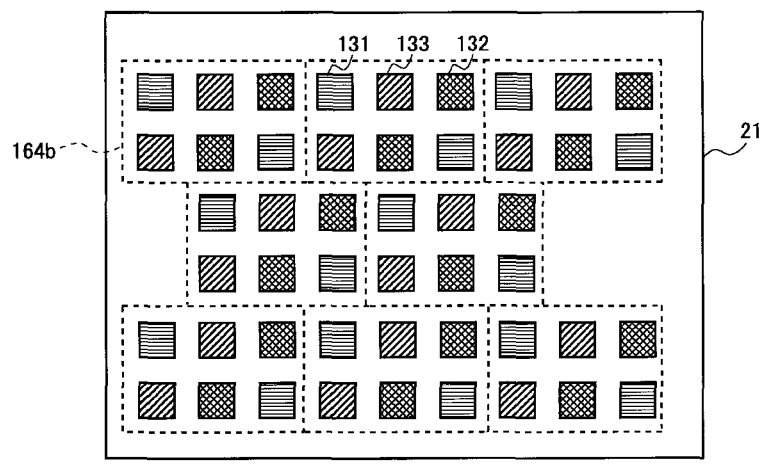
FIG. 17 is a diagram illustrating a state in which clusters illustrated in FIG. 16 are arranged on the LED substrate.

Furthermore, a positional relationship of adjacent clusters 164b is changed. FIG. 17 is a diagram illustrating a state in which clusters 164b illustrated in FIG. 16 are arranged on the LED substrate 21. As illustrated in FIG. 17, by arranging the clusters 164b in the horizontal direction, the blue light emitting bodies 133 which are adjacent in the vertical direction are no longer adjacent. With this configuration, not only the color unevenness in the horizontal direction but the color unevenness in the vertical direction can be suppressed.

3. Second Embodiment

Configuration of a liquid crystal display device and a backlight device according to a second embodiment of the present invention is the same as the configuration of the liquid crystal display device and the backlight device 100 according to the first embodiment, and therefore diagrams and description for the devices are omitted in the present embodiment. The drive voltage applying circuit which applies drive voltage to a magenta light emitting body 131, a cyan light emitting body 134, and a blue light emitting body 133 is also the same as the drive voltage applying circuit described in the first embodiment, and therefore diagrams and description for the drive voltage applying circuit are omitted in the present embodiment. Hereinafter, configuration and arrangement of clusters 165 in the present embodiment are described.

3.1 Configuration of Cluster

Figures 18, 19:
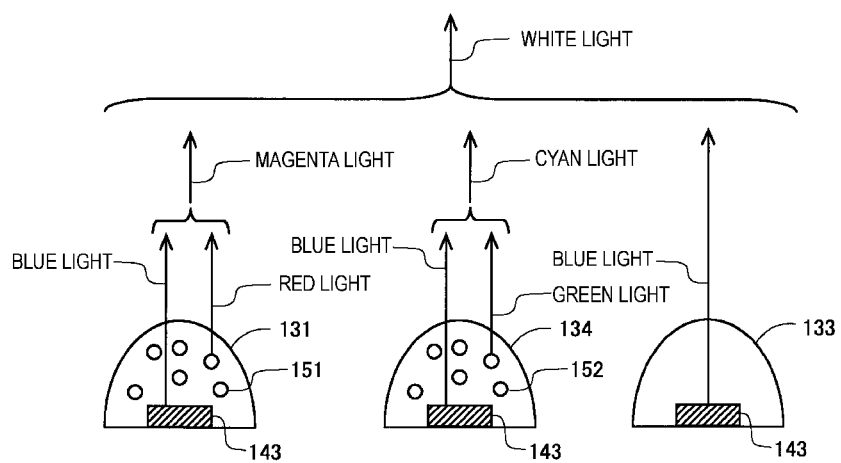
FIG. 18 is a diagram illustrating a structure of magenta, cyan and blue light emitting bodies, which are mounted on the backlight device according to a second embodiment of the present invention.
FIG. 19 is a diagram illustrating a summary of the relationship between the configuration of each of the light emitting bodies illustrated in FIG. 18 and the color of output light.

FIG. 18 is a diagram illustrating a structure of magenta, cyan and blue light emitting bodies 131, 134, and 133, which are mounted on the backlight device according to the present embodiment. As illustrated in FIG. 18, the backlight device includes the blue light emitting body 133, the magenta light emitting body 131, and the cyan light emitting body 134. Since the structures of the blue light emitting body 133 and the magenta light emitting body 131 are described in the first embodiment, the description thereof is omitted and the cyan light emitting body 134 is described in the present embodiment.

The cyan light emitting body 134 has a structure with green phosphors 152 covering a blue LED element 143, and the green phosphors 152 are excited to a higher energy level by the blue light emitted from the blue LED element 143, and after that, emit green light at the time of transition to a lower energy level. Therefore, a part of the blue light emitted by the blue LED element 143 and the green light emitted by the green phosphors 152 are mixed, and the cyan light emitting body 134 emits cyan light. When the cyan light is emitted from the cyan light emitting body 134, the magenta light is emitted from the magenta light emitting body 131, and the blue light is emitted from the blue light emitting body 133 in this way, white light is generated by the mixture of the emitted light and irradiated to the liquid crystal panel 105. The following is a summary of the relationship between the configuration of each of the above-described light emitting bodies 131, 134, and 133 and the color of output light. FIG. 19 is a diagram illustrating the summary of the relationship between the configuration of each of the light emitting bodies 131, 134, and 133 illustrated in FIG. 18 and the color of output light. As illustrated in FIG. 19, the magenta light emitting body 131 serving as a first light emitting body emits the magenta light, the cyan light emitting body 134 serving as a second light emitting body emits the cyan light, and the blue light emitting body 133 serving as a third light emitting body emits the blue light.

Figure 20:
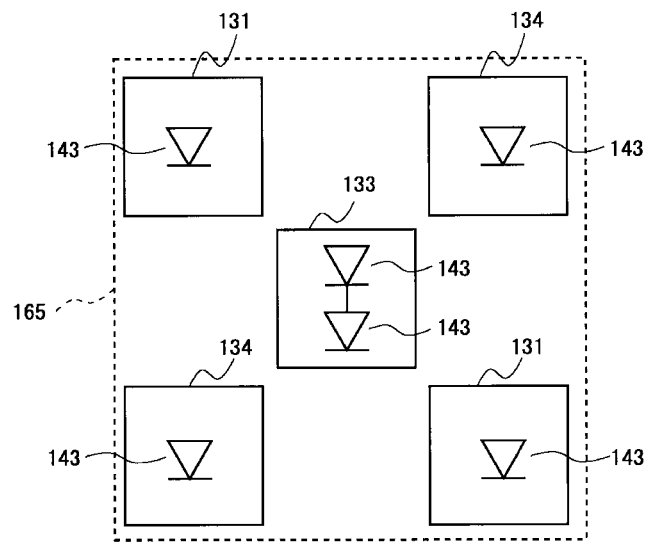
FIG. 20 is a diagram illustrating an arrangement of respective light emitting bodies in a cluster, and a number of green and blue LED elements implemented in respective light emitting bodies according to the second embodiment.

FIG. 20 is a diagram illustrating an arrangement of respective light emitting bodies 131, 134, and 133 in the cluster 165, and the number of LED elements 142 and 143 implemented in respective light emitting bodies 131, 134, and 133. As illustrated in FIG. 20, two magenta light emitting bodies 131 and two cyan light emitting bodies 134 are arranged in the cluster 165, and one blue light emitting body 133 is arranged in the cluster 165. Two blue LED elements 143 are implemented in a package of the blue light emitting body 133, and one blue LED element 143 is implemented in a package of each of two magenta light emitting bodies 131 and a package of each of two cyan light emitting bodies 134. The shape of the cluster 165 is a square shape with substantially the same lengths in horizontal and vertical directions, and two magenta light emitting bodies 131 and two cyan light emitting bodies 134 are arranged in different diagonal directions so that the light emitting bodies of the same color are not adjacent to each other around the circumference in the cluster 165. The blue light emitting body 133 is arranged in the center of the cluster 165 which is an area surrounded by the magenta and cyan light emitting bodies.

Figure 21:
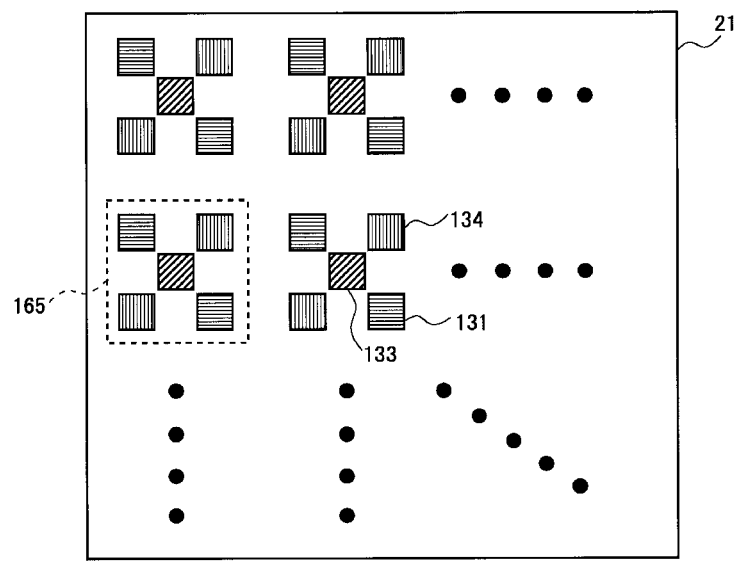
FIG. 21 is a diagram illustrating an arrangement of clusters on the LED substrate of the second embodiment.

FIG. 21 is a diagram illustrating an arrangement of clusters 165 on the LED substrate 21 of the present embodiment. As illustrated in FIG. 21, respective clusters 165 are arranged regularly. Therefore, each magenta light emitting body 131 of each cluster 165 is adjacent to the cyan light emitting bodies 134 of neighboring clusters 165, and each cyan light emitting body 134 is adjacent to the magenta light emitting bodies 131 of neighboring clusters 165. With this configuration, as the magenta light or the cyan light is not emphasized, occurrence of color unevenness can be suppressed. Furthermore, since the shape of each cluster 165 is a substantial square with high symmetry, the color unevenness of an image displayed on the liquid crystal panel 105 is suppressed in any direction.

3.2 Effect

The cyan light emitting body 134 including both the blue LED element 143 with the high drive voltage and the green phosphors 152 covering the blue LED element 143 is used instead of a red light emitting body in which a red LED element with low drive voltage is implemented, and each of the clusters 165 is configured by two magenta light emitting bodies 131, two cyan light emitting bodies 134, and one blue light emitting body 133. Since the blue LED element 143 is implemented also in each of two magenta light emitting bodies 131, the drive voltage of the magenta light emitting bodies 131 is substantially equal to the drive voltage of the cyan light emitting bodies 134 and the blue light emitting body 133. As a result, power consumption of the magenta light emitting bodies 131 is substantially equal to the power consumption of the cyan light emitting bodies 134 and the blue light emitting body 133, and power loss does not occur in the magenta light emitting bodies 131.

Furthermore, since the magenta light emitting body 131 of the cluster 165 is adjacent to the cyan light emitting bodies 134 of the neighboring clusters 165, and the shape of each cluster 165 is a substantial square with high symmetry, occurrence of color unevenness of an image displayed on the liquid crystal panel 105 is suppressed in any direction.

3.3 Modification

Figure 22:
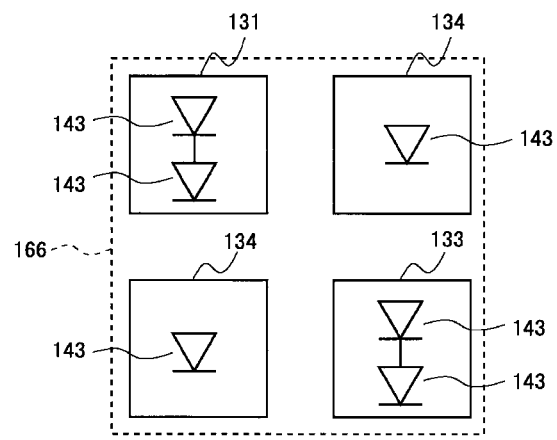
FIG. 22 is a diagram illustrating an arrangement of respective light emitting bodies in a cluster, and a number of green and blue LED elements implemented in respective light emitting bodies according to a modification of the second embodiment.

FIG. 22 is a diagram illustrating an arrangement of respective light emitting bodies 131, 133, and 134 in a cluster 166, and the number of LED elements 142 and 143 implemented in respective light emitting bodies 131, 133, and 134 according to a modification of the present embodiment. As illustrated in FIG. 22, one magenta light emitting body 131 and one blue light emitting body 133 are arranged in the cluster 166, and two cyan light emitting bodies 134 are arranged in the cluster 166. Two blue LED elements 143 are implemented in a package of the magenta light emitting body 131 and a package of the blue light emitting body 133. One blue LED elements 143 is implemented in a package of two cyan light emitting bodies 134.

The shape of the cluster 166 is a square shape with substantially the same lengths in horizontal and vertical directions. Two cyan light emitting bodies 134 are arranged in a diagonal direction so that the light emitting bodies are not adjacent to each other around the circumference in the cluster 166, and the magenta light emitting body 131 and the blue light emitting body 133 are arranged adjacent to the cyan light emitting bodies 134 around the circumference in the cluster 166.

Figure 23:
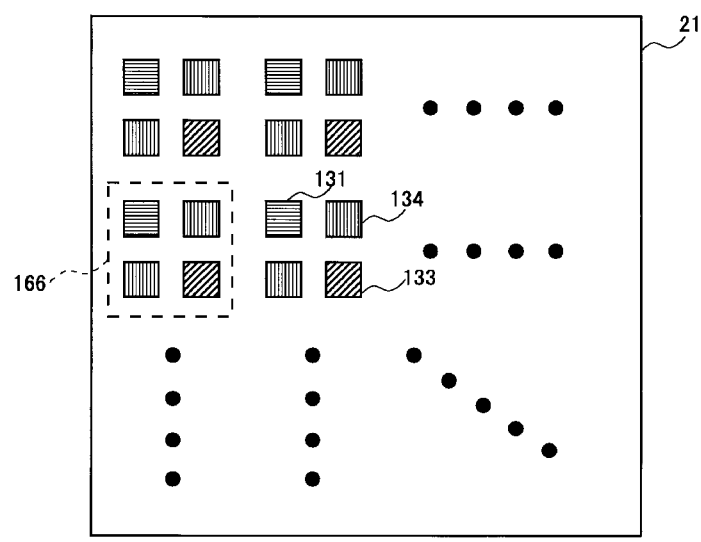
FIG. 23 is a diagram illustrating an arrangement of clusters on the LED substrate according to a first modification of the present embodiment.

FIG. 23 is a diagram illustrating an arrangement of clusters 166 on the LED substrate 21 according to the first modification of the present embodiment. As illustrated in FIG. 23, respective clusters 166 are arranged regularly. Therefore, each cyan light emitting body 134 of each cluster 166 is adjacent to the magenta light emitting body 131 or the blue light emitting body 133 of neighboring clusters 166. Note that the advantageous effect of the present modification is the same as the above-described embodiment, and therefore description thereof is omitted.

4. Third Embodiment

Configuration of a liquid crystal display device and a backlight device according to a third embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the magenta light emitting body 131, the green light emitting body 132, and the cyan light emitting body 134 is also the same as the drive voltage applying circuit described in the first embodiment, diagrams and description for the drive voltage applying circuit are omitted. Hereinafter, configuration of clusters in the present embodiment is described.

4.1 Configuration of Cluster

Figures 24, 25:
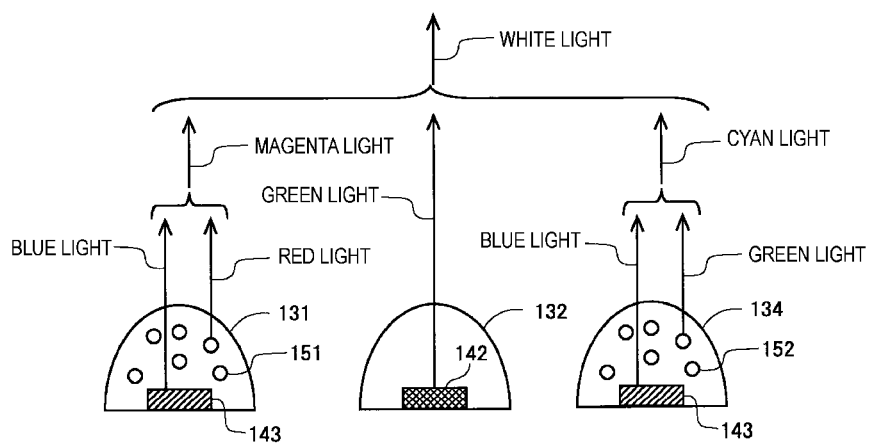
FIG. 24 is a diagram illustrating a structure of magenta, green and cyan light emitting bodies, which are mounted on the backlight device according to a third embodiment of the present invention.
FIG. 25 is a diagram illustrating a summary of the relationship between the configuration of each of the light emitting bodies illustrated in FIG. 24 and the color of output light.

FIG. 24 is a diagram illustrating a structure of magenta, green and cyan light emitting bodies 131, 132, and 134, which are mounted on the backlight device. As illustrated in FIG. 24, the backlight device includes the magenta light emitting body 131, the green light emitting body 132, and the cyan light emitting body 134. Since the structures of the magenta light emitting body 131 and the green light emitting body 132 are described in the first embodiment and the structure of the cyan light emitting body 134 is described in the second embodiment, description thereof is omitted in the present embodiment.

When the magenta light is emitted from the magenta light emitting body 131, the green light is emitted from the green light emitting body 132, and the cyan light is emitted from the cyan light emitting body 134, white light is generated by the mixture of the emitted light and irradiated to the liquid crystal panel 105. The following is a summary of the relationship between the configuration of each of the above-described light emitting bodies 131, 132, and 134 and the color of the output light. FIG. 25 is a diagram illustrating the summary of the relationship between the configuration of each of the light emitting bodies 131, 132, and 134 illustrated in FIG. 24 and the color of the output light. As illustrated in FIG. 25, the magenta light emitting body 131 serving as a first light emitting body emits the magenta light, the green light emitting body 132 serving as a second light emitting body emits the green light, and the cyan light emitting body 134 serving as a third light emitting body emits the cyan light.

Figure 26:
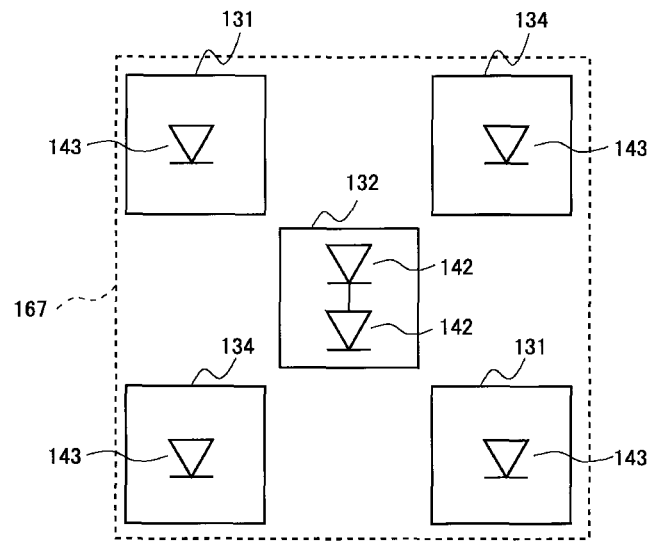
FIG. 26 is a diagram illustrating an arrangement of respective light emitting bodies in a cluster, and a number of green and blue LED elements implemented in respective light emitting bodies according to a third embodiment.

FIG. 26 is a diagram illustrating an arrangement of respective light emitting bodies 131, 132, and 134 in the cluster 167, and the number of LED elements 142 and 143 implemented in respective light emitting bodies 131, 132, and 134. As illustrated in FIG. 26, two magenta light emitting bodies 131 and two cyan light emitting bodies 134 are arranged in the cluster 167, and one green light emitting body 132 is arranged in the cluster 167. Two green LED element 142 are implemented in a package of green light emitting body 132, and one blue LED element 143 is implemented in a package of each of two magenta light emitting bodies 131 and a package of each of two cyan light emitting bodies 134. The shape of the cluster 167 is a square shape with substantially the same lengths in horizontal and vertical directions, and two magenta light emitting bodies 131 and two cyan light emitting bodies 134 are arranged in different diagonal directions so that the light emitting bodies of the same color are not adjacent to each other around the circumference in the cluster 167. The green light emitting body 132 is arranged in the center of the cluster 167 which is an area surrounded by the magenta and cyan light emitting bodies.

Figure 27:
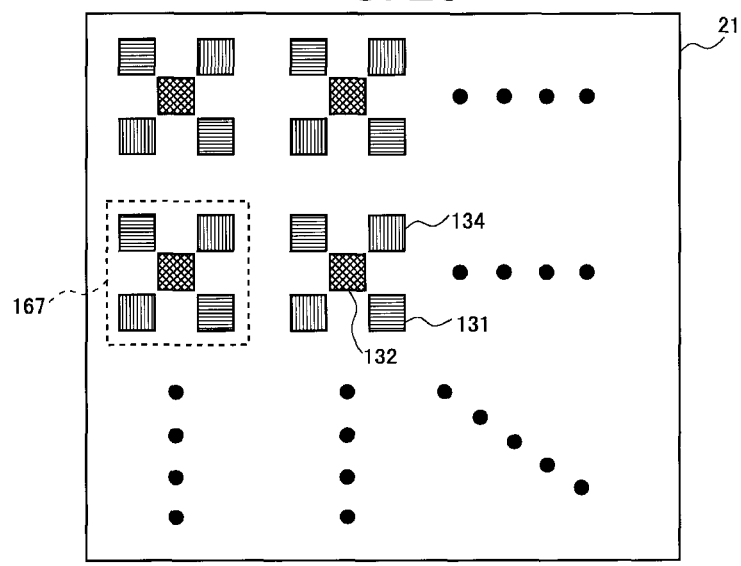
FIG. 27 is a diagram illustrating an arrangement of clusters on the LED substrate of the third embodiment.

FIG. 27 is a diagram illustrating an arrangement of clusters 167 on the LED substrate 21 of the present embodiment. As illustrated in FIG. 27, respective clusters 167 are arranged regularly. Therefore, each magenta light emitting body 131 of each cluster 167 is adjacent to the cyan light emitting bodies 134 of neighboring clusters 167, and each cyan light emitting body 134 is adjacent to the magenta light emitting bodies 131 of neighboring clusters 167. With this configuration, as the magenta light or the cyan light is not emphasized, occurrence of color unevenness can be suppressed. Furthermore, since the shape of each cluster 167 is a substantial square with high symmetry, the color unevenness of an image displayed on the liquid crystal panel 105 is suppressed in any direction.

4.2 Effect

The magenta light emitting body 131 including the both blue LED element 143 with high drive voltage and the red phosphors 151 covering the blue LED element 143 is used instead of a red light emitting body in which a red LED element with low drive voltage is implemented, and each of the clusters 167 is configured by two magenta light emitting bodies 131, two cyan light emitting bodies 134, and one green light emitting body 132. Since the blue LED element 143 is implemented also in each of two magenta light emitting bodies 131, the drive voltage of the magenta light emitting bodies 131 is substantially equal to the drive voltage of the green light emitting bodies 132 and the cyan light emitting body 134. As a result, power consumption of the magenta light emitting bodies 131 is substantially equal to the power consumption of the green light emitting bodies 132 and the cyan light emitting body 134, and power loss does not occur in the magenta light emitting bodies 131.

Furthermore, since the magenta light emitting body 131 of the cluster 167 is adjacent to the cyan light emitting bodies 134 of the neighboring clusters 167, and the shape of each cluster 167 is a substantial square with high symmetry, occurrence of color unevenness of an image displayed on the liquid crystal panel 105 is suppressed in any direction.

4.3 Modification

Figure 28:
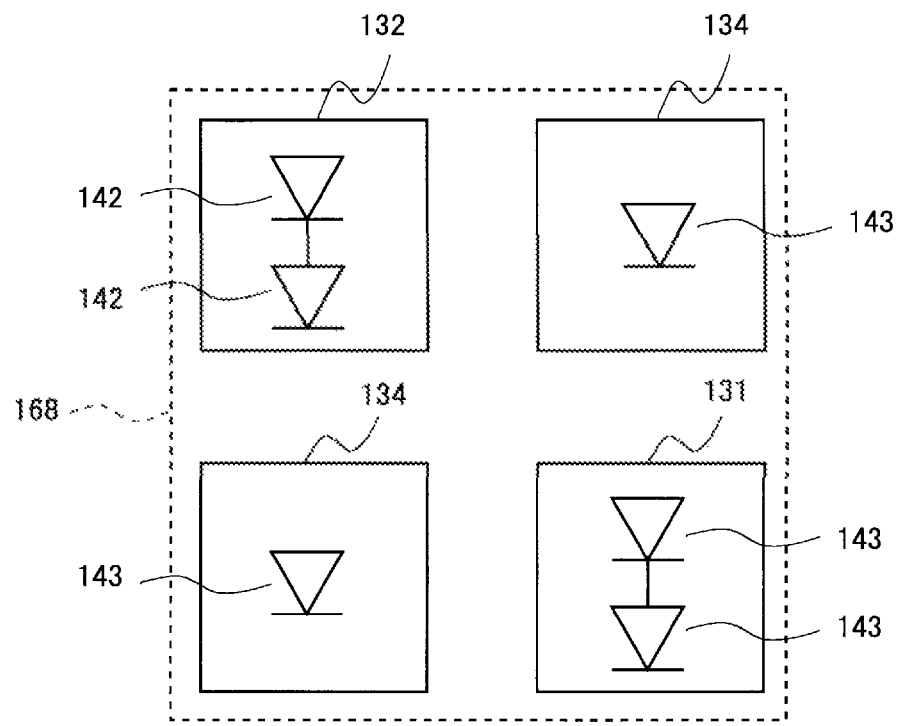
FIG. 28 is a diagram illustrating an arrangement of respective light emitting bodies in a cluster, and a number of green and blue LED elements implemented in respective light emitting bodies according to a modification of the third embodiment.

FIG. 28 is a diagram illustrating an arrangement of respective light emitting bodies 131, 132, and 134 in a cluster 168, and the number of LED elements 142 and 143 implemented in respective light emitting bodies 131, 132, and 134 according to a modification of the present embodiment. As illustrated in FIG. 28, one magenta light emitting body 131 and one green light emitting body 132 are arranged in the cluster 168, and two cyan light emitting bodies 134 are arranged in the cluster 168. Two blue LED elements 143 are implemented in each package of the magenta light emitting body 131 and the blue light emitting body 133. One blue LED elements 143 is implemented in a package of each cyan light emitting body 134.

The shape of the cluster 168 is a square shape with substantially the same lengths in horizontal and vertical directions. Two cyan light emitting bodies 134 are arranged so that the light emitting bodies are not adjacent to each other at the circumference in the cluster 168, and the magenta light emitting body 131 and the green light emitting body 132 are arranged adjacent to the cyan light emitting bodies 134 around the circumference in the cluster 168.

Figure 29:
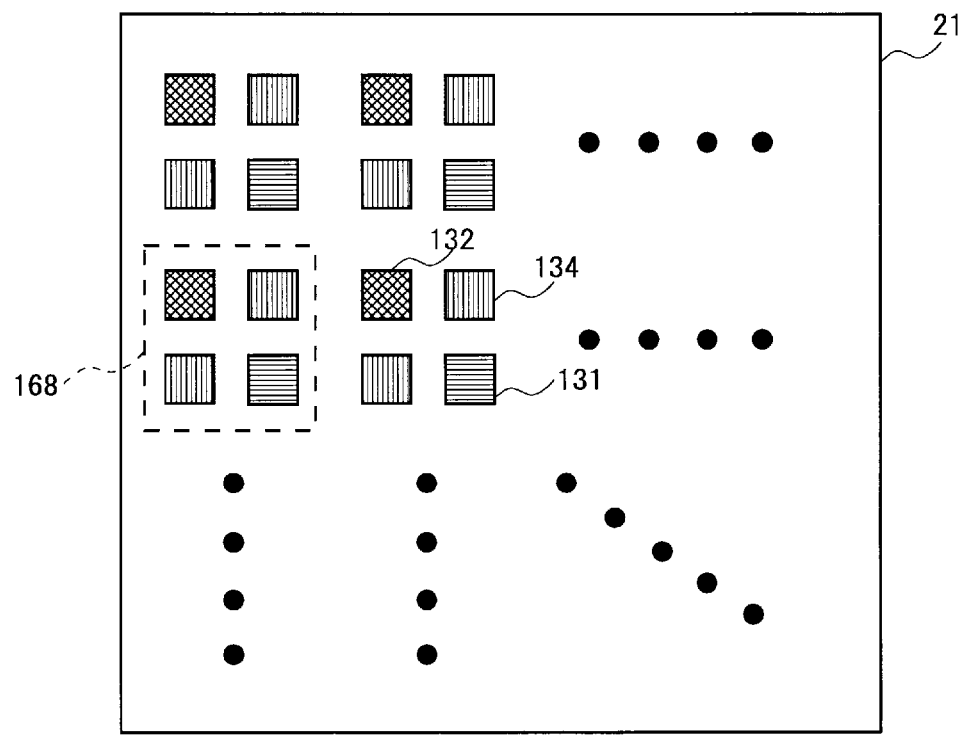
FIG. 29 is a diagram illustrating an arrangement of light emitting bodies 131, 132 and 134 on the LED substrate 21 according to a first modification of the third embodiment.

FIG. 29 is a diagram illustrating an arrangement of the clusters 168 on the LED substrate 21 according to the first modification of the present embodiment. As illustrated in FIG. 29, respective clusters 168 are arranged regularly. Therefore, each cyan light emitting body 134 of each cluster 168 is adjacent to the magenta light emitting body 131 or the green light emitting body 132 of neighboring clusters 168. Note that the advantageous effect of the present modification is the same as the above-described embodiment, and therefore description thereof is omitted.

5. Fourth Embodiment

Configuration of a liquid crystal display device and a backlight device according to a fourth embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the magenta light emitting body 131, the yellow light emitting body 135, and the blue light emitting body 133 is also the same as the drive voltage applying circuit described in the first embodiment with the exception that the green light emitting body 132 is replaced with a yellow light emitting body 135, diagrams and description for the drive voltage applying circuit are omitted. Hereinafter, configuration of clusters 169 in the present embodiment is described.

5.1 Configuration of Cluster

Figures 30, 31:
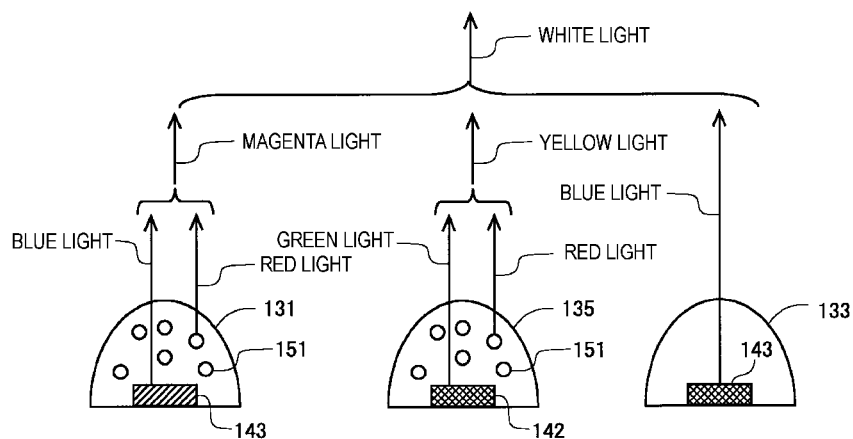
FIG. 30 is a diagram illustrating a structure of magenta, yellow and blue light emitting bodies, which are mounted on the backlight device according to a fourth embodiment of the present invention.
FIG. 31 is a diagram illustrating a summary of the relationship between the configuration of each of the light emitting bodies illustrated in FIG. 30 and the color of output light.

FIG. 30 is a diagram illustrating a structure of magenta, yellow and blue light emitting bodies 131, 135, and 133, which are mounted on the backlight device. As illustrated in FIG. 30, the backlight device includes the magenta light emitting body 131, the yellow light emitting body 135, and the blue light emitting body 133. Since the structures of the magenta light emitting body 131 and the blue light emitting body 133 are described in the first embodiment, description thereof is omitted and the yellow light emitting body 135 is described.

The yellow light emitting body 135 has a structure with red phosphors 151 covering a green LED element 142, and the red phosphors 151 are excited to a higher energy level by the green light emitted from the green LED element 142, and after that, emit red light at the time of transition to a lower energy level. Therefore, a part of the green light emitted by the green LED element 142 and the red light emitted by the red phosphors 151 are mixed, and the yellow light emitting body 135 emits yellow light. In this way, when the magenta light is emitted from the magenta light emitting body 131, the yellow light is emitted from the yellow light emitting body 135, and the blue light is emitted from the blue light emitting body 133, white light is generated by the mixture of the emitted light and irradiated to the liquid crystal panel 105. The following is a summary of the relationship between the configuration of each of the above-described light emitting bodies 131, 135, and 133 and the color of output light. FIG. 31 is a diagram illustrating the summary of the relationship between the configuration of each of the light emitting bodies 131, 135, and 133 illustrated in FIG. 30 and the color of output light. As illustrated in FIG. 31, the magenta light emitting body 131 serving as a first light emitting body emits the magenta light, the yellow light emitting body 135 serving as a second light emitting body emits the yellow light, and the blue light emitting body 133 serving as a third light emitting body emits the blue light.

Figure 32:
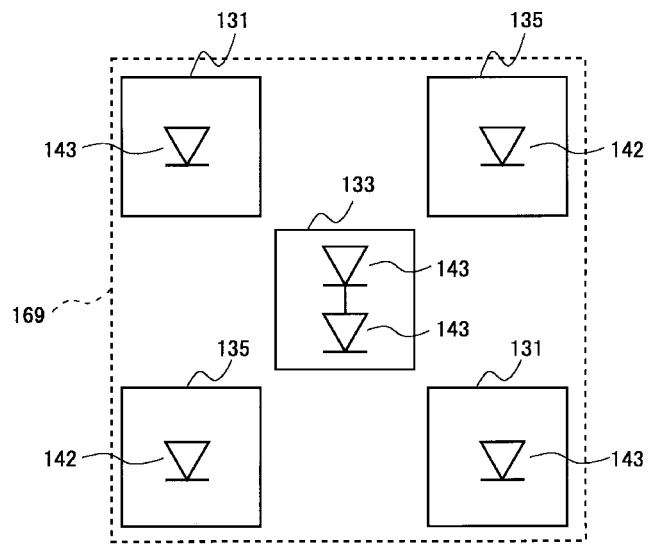
FIG. 32 is a diagram illustrating an arrangement of respective light emitting bodies in a cluster, and a number of green and blue LED elements implemented in respective light emitting bodies according to a fourth embodiment.

FIG. 32 is a diagram illustrating an arrangement of respective light emitting bodies 131, 135, and 133 in the cluster 169, and the number of LED elements 142 and 143 implemented in respective light emitting bodies 131, 135, and 133. As illustrated in FIG. 32, two magenta light emitting bodies 131 and two yellow light emitting bodies 135 are arranged in the cluster 169, and one blue light emitting body 133 is arranged in the cluster 169. Two blue LED elements 143 are implemented in a package of the blue light emitting body 133, one blue LED element 143 is implemented in a package of each of two magenta light emitting bodies 131, and one green LED element 142 is implemented in a package of each of two yellow light emitting bodies 135. The shape of the cluster 169 is a square shape with substantially the same lengths in horizontal and vertical directions, and two magenta light emitting bodies 131 and two yellow light emitting bodies 135 are arranged in different diagonal directions so that the light emitting bodies of the same color are not adjacent to each other around the circumference in the cluster 169. The blue light emitting body 133 is arranged in the center of the cluster 169 which is an area surrounded by the magenta and yellow light emitting bodies.

Figure 33:
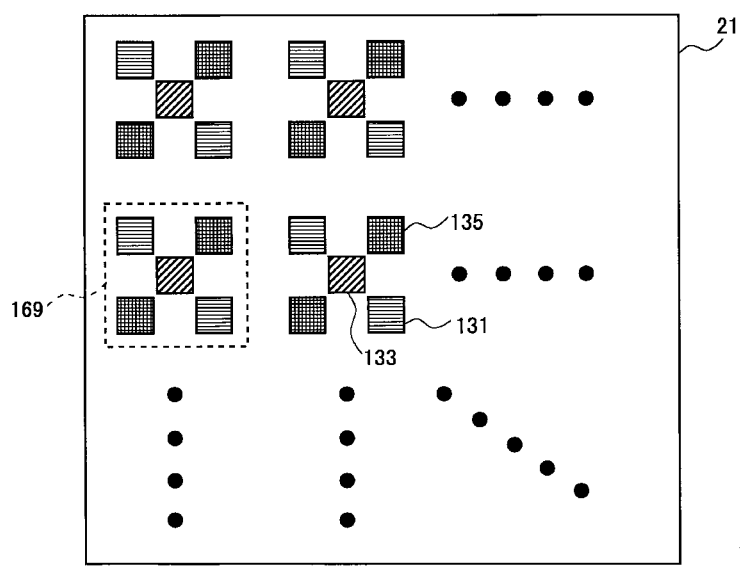
FIG. 33 is a diagram illustrating an arrangement of clusters on the LED substrate of the fourth embodiment.

FIG. 33 is a diagram illustrating an arrangement of clusters 169 on the LED substrate 21 of the present embodiment. As illustrated in FIG. 33, respective clusters 169 are arranged regularly. Therefore, each magenta light emitting body 131 of each cluster 169 is adjacent to the yellow light emitting bodies 135 of neighboring clusters 169, and each yellow light emitting body 135 is adjacent to the magenta light emitting bodies 131 of neighboring clusters 169. With this configuration, as the magenta light or the yellow light is not emphasized, occurrence of color unevenness can be suppressed. Furthermore, since the shape of each cluster 169 is a substantial square with high symmetry, the color unevenness of an image displayed on the liquid crystal panel 105 is suppressed in any direction.

5.2 Effect

The magenta light emitting body 131 including both the blue LED element 143 with high drive voltage and the red phosphors 151 covering the blue LED element 143 is used instead of a red light emitting body in which a red LED element with low drive voltage is implemented, and each of the clusters 169 is configured by two magenta light emitting bodies 131, two yellow light emitting bodies 135, and one blue light emitting body 133. Since the blue LED element 143 is implemented also in each of two magenta light emitting bodies 131, the drive voltage of the magenta light emitting bodies 131 is substantially equal to the drive voltage of the yellow light emitting bodies 135 and the blue light emitting body 133. As a result, power consumption of the magenta light emitting bodies 131 is substantially equal to the power consumption of the yellow light emitting bodies 135 and the blue light emitting body 133, and power loss does not occur in the magenta light emitting bodies 131.

Furthermore, since the magenta light emitting body 131 of the cluster 169 is adjacent to the yellow light emitting bodies 135 of the neighboring clusters 169, and the shape of each cluster 169 is a substantial square with high symmetry, occurrence of color unevenness of an image displayed on the liquid crystal panel 105 is suppressed in any direction.

6. Fifth Embodiment

Configuration of a liquid crystal display device and a backlight device according to a fifth embodiment of the present invention is the same as the configuration of the liquid crystal display device and the backlight device 100 according to the first embodiment, and therefore diagrams and description for the devices are omitted in the present embodiment. A drive voltage applying circuit which applies drive voltage to a magenta light emitting body 131, an yellow light emitting body 135, and a cyan light emitting body 134 is a circuit in which the green light emitting body 132 and the blue light emitting body 133 in the drive voltage applying circuit described in the first embodiment are replaced to the yellow light emitting body 135 and the cyan light emitting body 134, respectively, and therefore diagrams and description for the drive voltage applying circuit are omitted. Hereinafter, configuration of clusters 170 in the present embodiment is described.

6.1 Configuration of Cluster

Figures 34, 35:
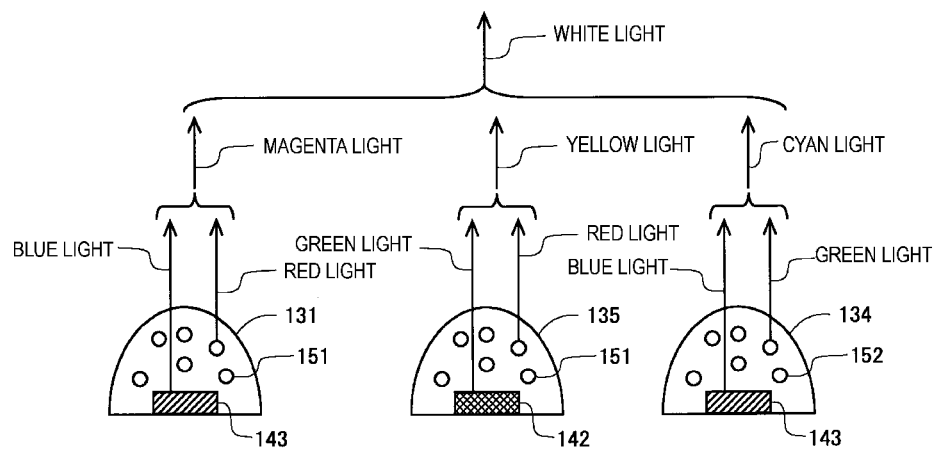
FIG. 34 is a diagram illustrating a structure of magenta, yellow and cyan light emitting bodies, which are mounted on the backlight device according to a fifth embodiment of the present invention.
FIG. 35 is a diagram illustrating a summary of the relationship between the configuration of each of the light emitting bodies illustrated in FIG. 34 and the color of output light.

FIG. 34 is a diagram illustrating a structure of magenta, yellow and cyan light emitting bodies 131, 135, and 134, which are mounted on the backlight device. Among the light emitting bodies 131, 135, and 134 illustrated in FIG. 34, as the structure of the magenta light emitting body 131 is described in the first embodiment, the structure of the cyan light emitting body 134 is described in the second embodiment, and the structure of the yellow light emitting body 135 is described in the fourth embodiment, description thereof is omitted. When the magenta light is emitted from the magenta light emitting body 131, the yellow light is emitted from the yellow light emitting body 135, and the cyan light is emitted from the cyan light emitting body 134, white light is generated by the mixture of the emitted light and irradiated to the liquid crystal panel 105. The following is a summary of the relationship between the configuration of each of the above-described light emitting bodies and the color of output light. FIG. 35 is a diagram illustrating the summary of the relationship between the configuration of each of the light emitting bodies 131, 135, and 134 illustrated in FIG. 34 and the color of output light. As illustrated in FIG. 35, the magenta light emitting body 131 serving as a first light emitting body emits the magenta light, the yellow light emitting body 135 serving as a second light emitting body emits the yellow light, and the cyan light emitting body 134 serving as a third light emitting body emits the cyan light.

Figure 36:
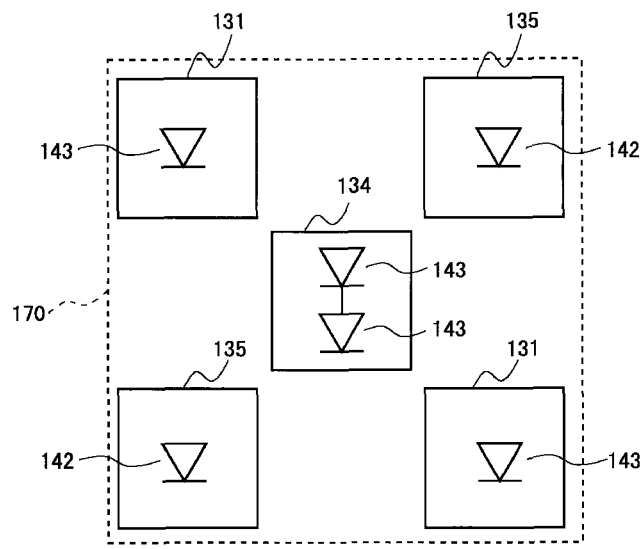
FIG. 36 is a diagram illustrating an arrangement of respective light emitting bodies in a cluster, and a number of green and blue LED elements implemented in respective light emitting bodies according to the fifth embodiment.

FIG. 36 is a diagram illustrating an arrangement of respective light emitting bodies 131, 135, and 134 in the cluster 170, and the number of LED elements 142 and 143 implemented in respective light emitting bodies 131, 135, and 134. As illustrated in FIG. 36, two magenta light emitting bodies 131 and two yellow light emitting bodies 135 are arranged in the cluster 170, and one cyan light emitting body 134 is arranged in the cluster 170. Two blue LED elements 143 are implemented in a package of the cyan light emitting body 134, one blue LED element 143 is implemented in a package of each of two magenta light emitting bodies 131, and one green LED element 142 is implemented in a package of each of two yellow light emitting bodies 135. The shape of the cluster 170 is a square shape with substantially the same lengths in horizontal and vertical directions, and two magenta light emitting bodies 131 and two yellow light emitting bodies 135 are arranged in different diagonal directions so that the light emitting bodies of the same color are not adjacent to each other around the circumference in the cluster 170. The cyan light emitting body 134 is arranged in the center of the cluster 170 which is an area surrounded by the magenta and yellow light emitting bodies.

Figure 37:
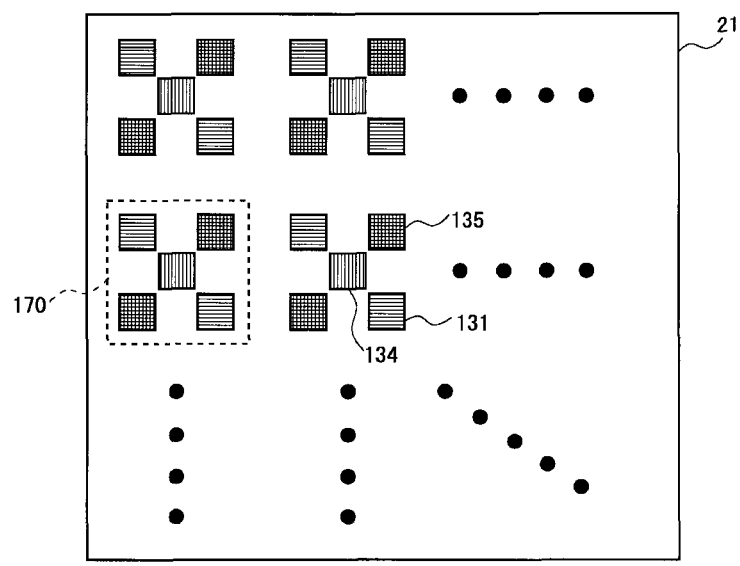
FIG. 37 is a diagram illustrating an arrangement of clusters on the LED substrate of the fifth embodiment.

FIG. 37 is a diagram illustrating an arrangement of clusters 170 on the LED substrate 21 of the present embodiment. As illustrated in FIG. 37, respective clusters 170 are arranged regularly. Therefore, each magenta light emitting body 131 of each cluster 170 is adjacent to the yellow light emitting bodies 135 of neighboring clusters 170, and each yellow light emitting body 135 is adjacent to the magenta light emitting bodies 131 of neighboring clusters 170. With this configuration, as the magenta light or the yellow light is not emphasized, occurrence of color unevenness can be suppressed. Furthermore, since the shape of each cluster 170 is a substantial square with high symmetry, the color unevenness of an image displayed on the liquid crystal panel 105 is suppressed in any direction.

6.2 Effect

According to the present embodiment, power consumption of the magenta light emitting bodies 131 is substantially equal to the power consumption of the yellow light emitting bodies 135 and the cyan light emitting body 134, and power loss does not occur in the magenta light emitting bodies 131. Furthermore, the color unevenness of an image displayed on the liquid crystal panel 105 is suppressed in any direction.

7. Sixth Embodiment

Configuration of a liquid crystal display device and a backlight device according to a sixth embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the yellow light emitting body 135, the green light emitting body 132 and the blue light emitting body 133 is also the same as the drive voltage applying circuit described in the first embodiment with the exception that the magenta light emitting body 131 is replaced with a yellow light emitting body 135, diagrams and description for the drive voltage applying circuit are omitted. Hereinafter, configuration of clusters 171 in the present embodiment is described.

7.1 Configuration of Cluster

Figures 38, 39:
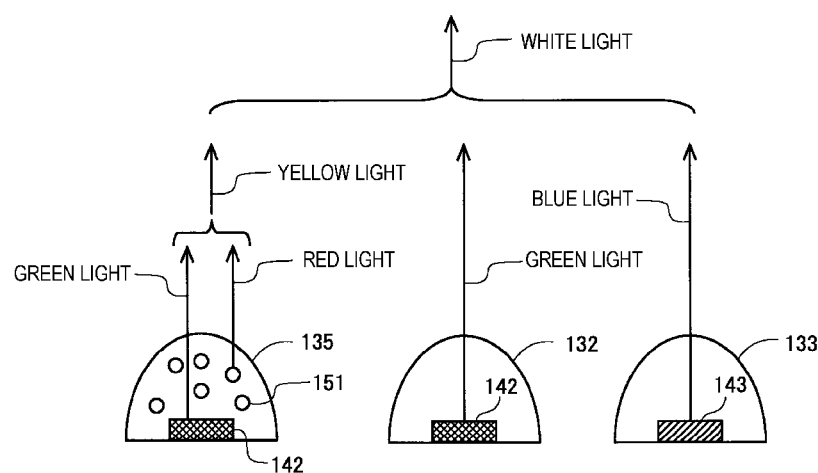
FIG. 38 is a diagram illustrating a structure of yellow, green and blue light emitting bodies, which are mounted on the backlight device, according to a sixth embodiment of the present invention.
FIG. 39 is a diagram illustrating a summary of the relationship between the configuration of each of the light emitting bodies illustrated in FIG. 38 and the color of output light.

FIG. 38 is a diagram illustrating a structure of yellow, green and blue light emitting bodies 135, 132, and 133, which are mounted on the backlight device. Among the light emitting bodies 135, 132, and 133 illustrated in FIG. 38, as the structures of the green light emitting body 132 and the blue light emitting body 133 are described in the first embodiment, and the structure of the yellow light emitting body 135 is described in the fourth embodiment, description thereof is omitted. When the yellow light is emitted from the yellow light emitting body 135, the green light is emitted from the green light emitting body 132, and the blue light is emitted from the blue light emitting body 133, white light is generated by the mixture of the emitted light and irradiated to the liquid crystal panel 105.

FIG. 39 is a diagram illustrating the summary of the relationship between the configuration of each of the light emitting bodies 135, 132, and 133 illustrated in FIG. 38 and the color of output light. As illustrated in FIG. 39, the yellow light emitting body 135 serving as a first light emitting body emits the yellow light, the green light emitting body 132 serving as a second light emitting body emits the green light, and the blue light emitting body 133 serving as a third light emitting body emits the blue light.

Figure 40:
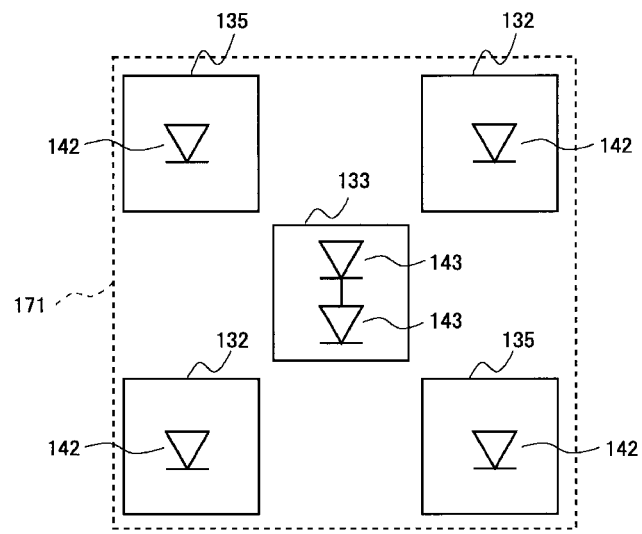
FIG. 40 is a diagram illustrating an arrangement of respective light emitting bodies in a cluster, and a number of green and blue LED elements implemented in respective light emitting bodies according to the sixth embodiment.

FIG. 40 is a diagram illustrating an arrangement of respective light emitting bodies 135, 132, and 133 in the cluster 171, and the number of LED elements 142 and 143 implemented in respective light emitting bodies 135, 132, and 133. As illustrated in FIG. 40, two yellow light emitting bodies 135 and two green light emitting bodies 132 are arranged in the cluster 171, and one blue light emitting body 133 is arranged in the cluster 171. Two blue LED elements 143 are implemented in a package of blue light emitting body 133, and one green LED element 142 is implemented in a package of each of two yellow light emitting bodies 135 and a package of each of two green light emitting bodies 132. The shape of the cluster 171 is a square shape with substantially the same lengths in horizontal and vertical directions, and two yellow light emitting bodies 135 and two green light emitting bodies 132 are arranged in different diagonal directions so that the light emitting bodies of the same color are not adjacent to each other around the circumference in the cluster 171. The blue light emitting body 133 is arranged in the center of the cluster 171 which is an area surrounded by the yellow and green light emitting bodies.

Figure 41:
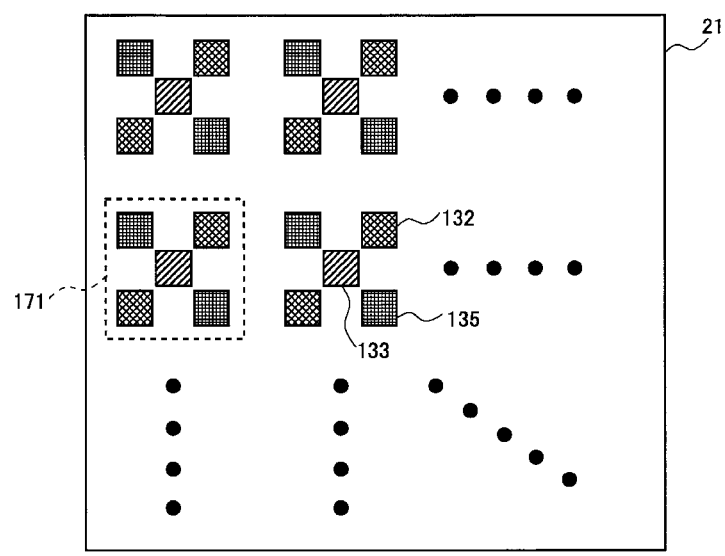
FIG. 41 is a diagram illustrating an arrangement of clusters on the LED substrate of the sixth embodiment.

FIG. 41 is a diagram illustrating an arrangement of clusters 171 on the LED substrate 21 of the present embodiment. As illustrated in FIG. 41, respective clusters 171 are arranged regularly. Therefore, each yellow light emitting body 135 of each cluster 171 is adjacent to the green light emitting bodies 132 of neighboring clusters 171, and each green light emitting body 132 is adjacent to the yellow light emitting bodies 135 of neighboring clusters 171. With this configuration, as the yellow light or the green light is not emphasized, occurrence of color unevenness can be suppressed. Furthermore, since the shape of each cluster 171 is a substantial square with high symmetry, the color unevenness of an image displayed on the liquid crystal panel 105 is suppressed in any direction.

7.2 Effect

According to the present embodiment, power consumption of the yellow light emitting bodies 135 is substantially equal to the power consumption of the green light emitting bodies 132 and the blue light emitting body 133, and power loss does not occur in the yellow light emitting bodies 135. Furthermore, the color unevenness of an image displayed on the liquid crystal panel 105 is suppressed in any direction.

8. Seventh Embodiment

Configuration of a liquid crystal display device and a backlight device according to a seventh embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the yellow light emitting body 135, the green light emitting body 132 and the magenta light emitting body 131 is also the same as the drive voltage applying circuit described in the first embodiment with the exception that the magenta light emitting body 131 is replaced with a yellow light emitting body 135, diagrams and description for the drive voltage applying circuit are omitted. Hereinafter, configuration of clusters 172 in the present embodiment is described.

8.1 Configuration of Cluster

Figures 42, 43:
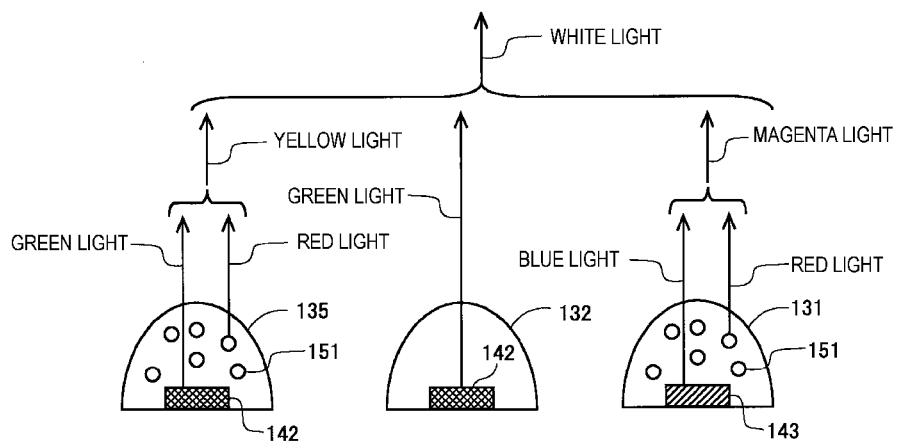
FIG. 42 is a diagram illustrating a structure of yellow, green and magenta light emitting bodies, which are mounted on the backlight device according to a seventh embodiment of the present invention.
FIG. 43 is a diagram illustrating a summary of the relationship between the configuration of each of the light emitting bodies illustrated in FIG. 42 and the color of output light.

FIG. 42 is a diagram illustrating a structure of yellow, green and magenta light emitting bodies 135, 132, and 131, which are mounted on the backlight device 100. Among the light emitting bodies 135, 132, and 131 illustrated in FIG. 42, as the structures of the green light emitting body 132 and the magenta light emitting body 131 are described in the first embodiment, and the structure of the yellow light emitting body 135 is described in the fourth embodiment, description thereof is omitted. When the yellow light is emitted from the yellow light emitting body 135, the green light is emitted from the green light emitting body 132, and the magenta light is emitted from the magenta light emitting body 131, white light is generated by the mixture of the emitted light and irradiated to the liquid crystal panel 105.

FIG. 43 is a diagram illustrating the summary of the relationship between the configuration of each of the light emitting bodies 135, 132, and 131 illustrated in FIG. 42 and the color of output light. As illustrated in FIG. 43, it can be understood that the yellow light emitting body 135 serving as a first light emitting body emits the yellow light, the green light emitting body 132 serving as a second light emitting body emits the green light, and the magenta light emitting body 131 serving as a third light emitting body emits the magenta light.

Figure 44:
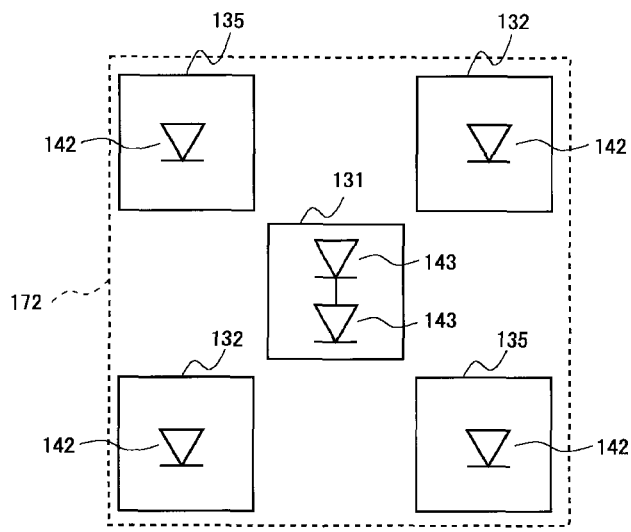
FIG. 44 is a diagram illustrating an arrangement of respective light emitting bodies in a cluster, and a number of green and blue LED elements implemented in respective light emitting bodies according to the seventh embodiment.

FIG. 44 is a diagram illustrating an arrangement of respective light emitting bodies 135, 132, and 131 in the cluster 172, and the number of LED elements 142 and 143 implemented in respective light emitting bodies 135, 132, and 131. As illustrated in FIG. 44, two yellow light emitting bodies 135 and two green light emitting bodies 132 are arranged in the cluster 172, and one magenta light emitting body 131 is arranged in the cluster 172. Two blue LED elements 143 are implemented in a package of magenta light emitting body 131, and one green LED element 142 is implemented in a package of each of two yellow light emitting bodies 135 and a package of each of two green light emitting bodies 132. The shape of the cluster 172 is a square shape with substantially the same lengths in horizontal and vertical directions, and two yellow light emitting bodies 135 and two green light emitting bodies 132 are arranged in different diagonal directions so that the light emitting bodies of the same color are not adjacent to each other around the circumference in the cluster 172. The magenta light emitting body 131 is arranged in the center of the cluster 172 which is an area surrounded by the yellow and green light emitting bodies.

Figure 45:
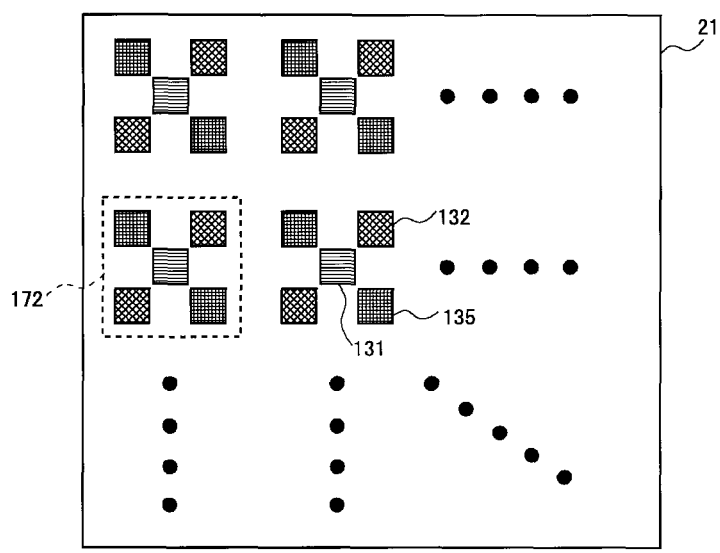
FIG. 45 is a diagram illustrating an arrangement of clusters on the LED substrate of the seventh embodiment.

FIG. 45 is a diagram illustrating an arrangement of clusters 172 on the LED substrate 21 of the present embodiment. As illustrated in FIG. 45, respective clusters 172 are arranged regularly. Therefore, each yellow light emitting body 135 of each cluster 172 is adjacent to the green light emitting bodies 132 of neighboring clusters 172, and each green light emitting body 132 is adjacent to the yellow light emitting bodies 135 of neighboring clusters 172. With this configuration, as the yellow light or the green light is not emphasized, occurrence of color unevenness can be suppressed. Furthermore, since the shape of each cluster 172 is a substantial square with high symmetry, the color unevenness of an image displayed on the liquid crystal panel 105 is suppressed in any direction.

8.2 Effect

According to the present embodiment, power consumption of the yellow light emitting bodies 135 and the magenta light emitting body 131 is substantially equal to the power consumption of the green light emitting bodies 132, and power loss does not occur in the yellow light emitting bodies 135 and the magenta light emitting body 131. Furthermore, the color unevenness of an image displayed on the liquid crystal panel 105 is suppressed in any direction.

9. Eighth Embodiment

Configuration of a liquid crystal display device and a backlight device according to an eighth embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the yellow light emitting body 135, the green light emitting body 132, and the cyan light emitting body 134 is also the same as the drive voltage applying circuit described in the first embodiment with the exceptions that the magenta light emitting body 131 is replaced with the yellow light emitting body 135 and the blue light emitting body 133 is replaced with the cyan light emitting body 134 diagrams and description for the drive voltage applying circuit are omitted. Hereinafter, configuration of clusters 173 in the present embodiment is described.

9.1 Configuration of Cluster

Figures 46, 47:
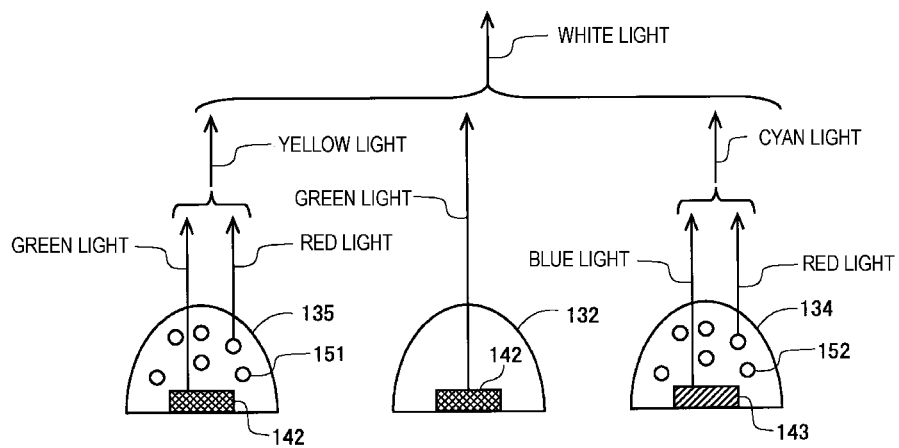
FIG. 46 is a diagram illustrating a structure of yellow, green and cyan light emitting bodies, which are mounted on the backlight device according to an eighth embodiment of the present invention.
FIG. 47 is a diagram illustrating a summary of the relationship between the configuration of each of the light emitting bodies illustrated in FIG. 46 and the color of output light.

FIG. 46 is a diagram illustrating a structure of yellow, green and cyan light emitting bodies 135, 132, and 134, which are mounted on the backlight device. Among the light emitting bodies 135, 132, and 134 illustrated in FIG. 46, as the structure of the green light emitting body 132 is described in the first embodiment, the structure of the cyan light emitting body 134 is described in the second embodiment, and the structure of the yellow light emitting body 135 is described in the fourth embodiment, description thereof is omitted. When the yellow light is emitted from the yellow light emitting body 135, the green light is emitted from the green light emitting body 132, and the cyan light is emitted from the cyan light emitting body 134, white light is generated by the mixture of the emitted light and irradiated to the liquid crystal panel 105.

FIG. 47 is a diagram illustrating the summary of the relationship between the configuration of each of the light emitting bodies 135, 132, and 134 illustrated in FIG. 46 and the color of output light. As illustrated in FIG. 47, it can be understood that the yellow light emitting body 135 serving as a first light emitting body emits the yellow light, the green light emitting body 132 serving as a second light emitting body emits the green light, and the cyan light emitting body 134 serving as a third light emitting body emits the cyan light.

Figure 48:
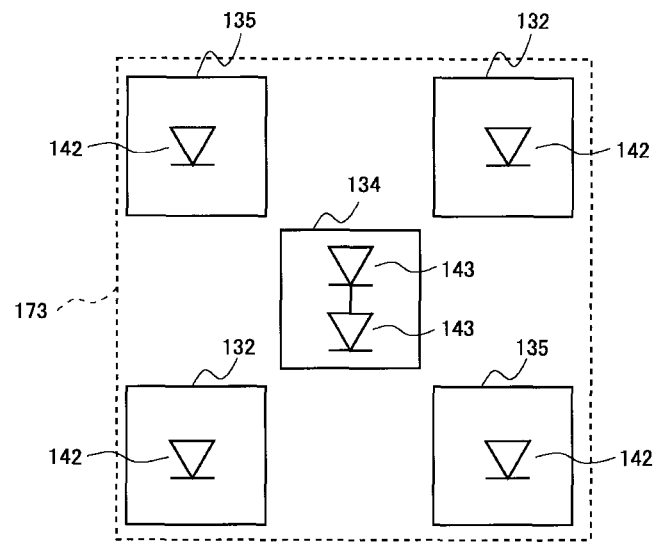
FIG. 48 is a diagram illustrating an arrangement of respective light emitting bodies in a cluster, and a number of green and blue LED elements implemented in respective light emitting bodies according to an eighth embodiment.

FIG. 48 is a diagram illustrating an arrangement of respective light emitting bodies 135, 132, and 134 in the cluster 173, and the number of LED elements 142 and 143 implemented in respective light emitting bodies 135, 132, and 134. As illustrated in FIG. 48, two yellow light emitting bodies 135 and two green light emitting bodies 132 are arranged in the cluster 173, and one cyan light emitting body 134 is arranged in the cluster 173. Two blue LED elements 143 are implemented in a package of cyan light emitting body 134, and one green LED element 142 is implemented in a package of each of two yellow light emitting bodies 135 and a package of each of two green light emitting bodies 132. The shape of the cluster 173 is a square shape with substantially the same lengths in horizontal and vertical directions, and two yellow light emitting bodies 135 and two green light emitting bodies 132 are arranged in different diagonal directions so that the light emitting bodies of the same color are not adjacent to each other around the circumference in the cluster 173. The cyan light emitting body 134 is arranged in the center of the cluster 173 which is an area surrounded by the yellow and green light emitting bodies.

Figure 49:
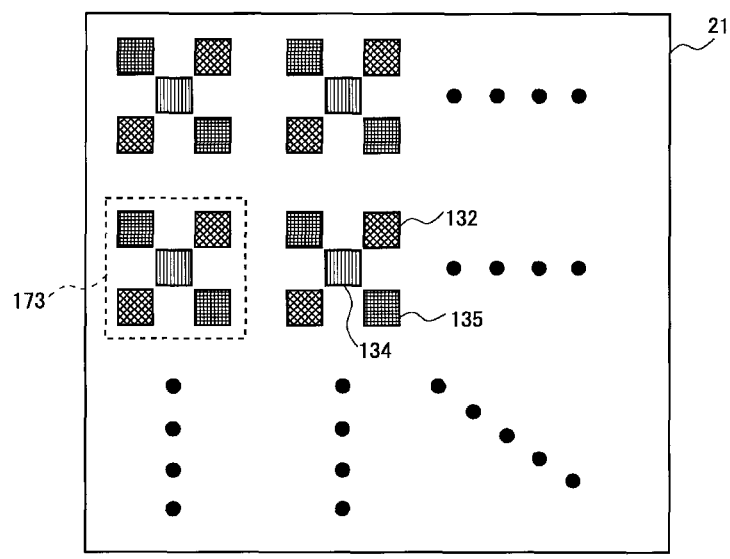
FIG. 49 is a diagram illustrating an arrangement of clusters on the LED substrate of the eighth embodiment.

FIG. 49 is a diagram illustrating an arrangement of clusters 173 on the LED substrate 21 of the present embodiment. As illustrated in FIG. 49, respective clusters 173 are arranged regularly. Therefore, each yellow light emitting body 135 of each cluster 173 is adjacent to the green light emitting bodies 132 of neighboring clusters 173, and each green light emitting body 132 is adjacent to the yellow light emitting bodies 135 of neighboring clusters 173. With this configuration, the yellow light or the green light is not emphasized, whereby occurrence of color unevenness can be suppressed. Furthermore, since the shape of each cluster 173 is a substantial square with high symmetry, the color unevenness of an image displayed on the liquid crystal panel 105 is suppressed in any direction.

9.2 Effect

According to the present embodiment, power consumption of the yellow light emitting bodies 135 is substantially equal to the power consumption of the green light emitting bodies 132 and the cyan light emitting body 134, and power loss does not occur in the yellow light emitting bodies 135. Furthermore, the color unevenness of an image displayed on the liquid crystal panel 105 is suppressed in any direction.

10. Ninth Embodiment

Configuration of a liquid crystal display device and a backlight device according to a ninth embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the yellow light emitting body 135, the cyan light emitting body 134, and the blue light emitting body 133 is also the same as the drive voltage applying circuit described in the first embodiment with the exceptions that the magenta light emitting body 131 is replaced with the yellow light emitting body 135 and the green light emitting body 132 is replaced with the cyan light emitting body 134, diagrams and description for the drive voltage applying circuit are omitted. Hereinafter, configuration of clusters 174 in the present embodiment is described.

10.1 Configuration of Cluster

Figures 50, 51:
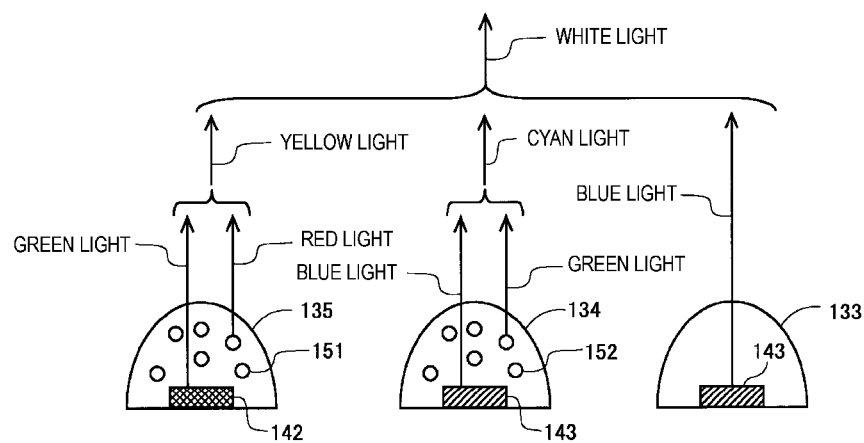
FIG. 50 is a diagram illustrating a structure of yellow, cyan and blue light emitting bodies 135, 134 and 133, which are mounted on the backlight device according to a ninth embodiment of the present invention.
FIG. 51 is a diagram illustrating a summary of a relationship between the configuration of each of the light emitting bodies illustrated in FIG. 50 and the color of output light.

FIG. 50 is a diagram illustrating a structure of yellow, cyan and blue light emitting bodies 135, 134, and 133, which are mounted on the backlight device. Among the light emitting bodies 135, 134, and 133 illustrated in FIG. 50, the structure of the blue light emitting body 133 is described in the first embodiment, the structure of the cyan light emitting body 134 is described in the second embodiment, and the structure of the yellow light emitting body 135 is described in the fourth embodiment. Therefore, those description is omitted. When the yellow light is emitted from the yellow light emitting body 135, the cyan light is emitted from the cyan light emitting body 134, and the blue light is emitted from the blue light emitting body 133, white light is generated by the mixture of the emitted light and irradiated to the liquid crystal panel 105.

FIG. 51 is a diagram illustrating the summary of the relationship between the configuration of each of the light emitting bodies 135, 134, and 133 illustrated in FIG. 50 and the color of the output light. As illustrated in FIG. 51, it can be understood that the yellow light emitting body 135 serving as a first light emitting body emits the yellow light, the cyan light emitting body 134 serving as a second light emitting body emits the cyan light, and the blue light emitting body 133 serving as a third light emitting body emits the blue light.

Figure 52:
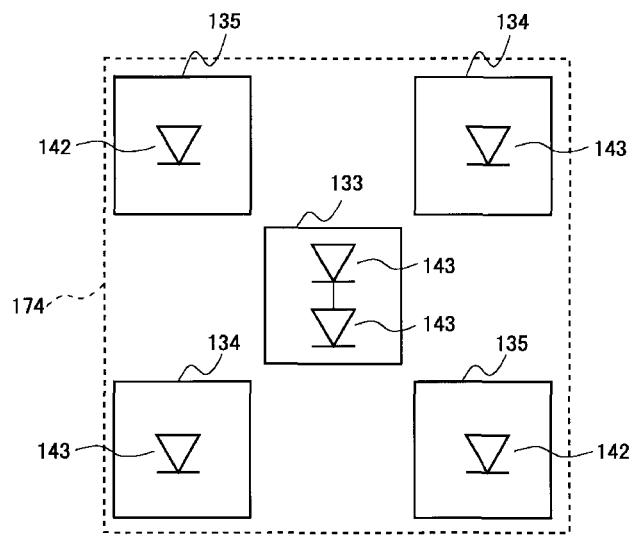
FIG. 52 is a diagram illustrating an arrangement of respective light emitting bodies in a cluster, and a number of green and blue LED elements implemented in respective light emitting bodies according to a ninth embodiment.

FIG. 52 is a diagram illustrating an arrangement of respective light emitting bodies 135, 134, and 133 in the cluster 174, and the number of LED elements 142 and 143 implemented in respective light emitting bodies 135, 134, and 133. As illustrated in FIG. 52, two yellow light emitting bodies 135 and two cyan light emitting bodies 134 are arranged in the cluster 174, and one blue light emitting body 133 is arranged in the cluster 174. One green LED element 142 is implemented in a package of each of two yellow light emitting bodies 135, one blue LED element 143 is implemented in a package of each of two cyan light emitting bodies 134, and two blue LED elements 143 are implemented in a package of the blue light emitting body 133. The shape of the cluster 174 is a square shape with substantially the same lengths in horizontal and vertical directions, and two yellow light emitting bodies 135 and two cyan light emitting bodies 134 are arranged in different diagonal directions so that the light emitting bodies of the same color are not adjacent to each other around the circumference in the cluster 174. The blue light emitting body 133 is arranged in the center of the cluster 174 which is an area surrounded by the yellow and cyan light emitting bodies.

Figure 53:
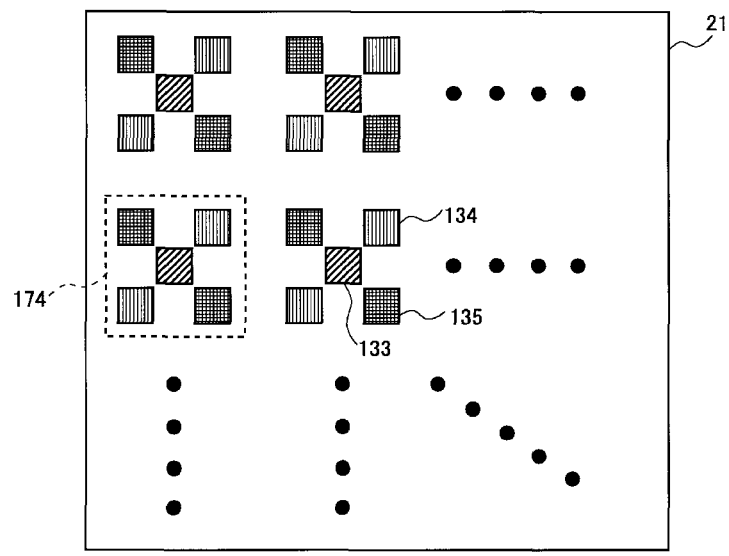
FIG. 53 is a diagram illustrating an arrangement of clusters on the LED substrate of the ninth embodiment.

FIG. 53 is a diagram illustrating an arrangement of clusters 174 on the LED substrate 21 of the present embodiment. As illustrated in FIG. 53, respective clusters 174 are arranged regularly. Therefore, each yellow light emitting body 135 of each cluster 174 is adjacent to the cyan light emitting bodies 134 of neighboring clusters 174, and each cyan light emitting body 134 is adjacent to the yellow light emitting bodies 135 of neighboring clusters 174. With this configuration, as neither the yellow light or the cyan light is emphasized, occurrence of color unevenness can be suppressed. Furthermore, since the shape of each cluster 174 is a substantial square with high symmetry, the color unevenness of an image displayed on the liquid crystal panel 105 is suppressed in any direction.

10.2 Effect

According to the present embodiment, power consumption of the yellow light emitting bodies 135 is substantially equal to the power consumption of the green light emitting bodies 132 and the blue light emitting body 133, and power loss does not occur in the yellow light emitting bodies 135. Furthermore, the color unevenness of an image displayed on the liquid crystal panel 105 is suppressed in any direction.

11. Tenth Embodiment

Configuration of a liquid crystal display device and a backlight device according to a tenth embodiment of the present invention is the same as the configuration of the liquid crystal display device and the backlight device 100 according to the first embodiment, and therefore diagrams and description for the devices are omitted in the present embodiment. As the drive voltage applying circuit which applies drive voltage to the yellow light emitting body 135, the cyan light emitting body 134, and the magenta light emitting body 131 is also the same as the drive voltage applying circuit described in the first embodiment with the exceptions that the green light emitting body 132 is replaced with the yellow light emitting body 135 and the blue light emitting body 133 is replaced with the cyan light emitting body 134, diagrams and description for the drive voltage applying circuit are omitted. Hereinafter, configuration of clusters 175 in the present embodiment is described.

11.1 Configuration of Cluster

Figures 54, 55:
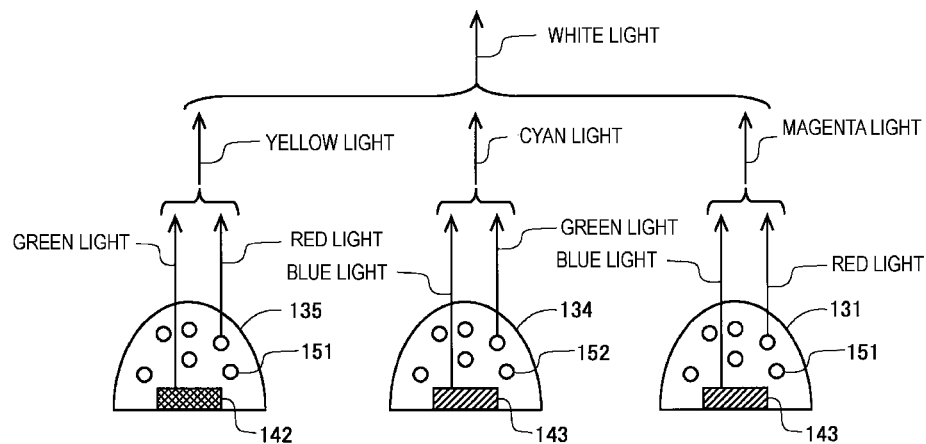
FIG. 54 is a diagram illustrating a structure of yellow, cyan and magenta light emitting bodies, which are mounted on the backlight device according to a tenth embodiment of the present invention.
FIG. 55 is a diagram illustrating a summary of the relationship between the configuration of each of the light emitting bodies illustrated in FIG. 54 and the color of output light.

FIG. 54 is a diagram illustrating a structure of yellow, cyan and magenta light emitting bodies 135, 134, and 131, which are mounted on the backlight device. Among the light emitting bodies 135, 134, and 131 illustrated in FIG. 54, as the structure of the magenta light emitting body 131 is described in the first embodiment, the structure of the cyan light emitting body 134 is described in the second embodiment, and the structure of the yellow light emitting body 135 is described in the fourth embodiment, description thereof is omitted. When the yellow light is emitted from the yellow light emitting body 135, the cyan light is emitted from the cyan light emitting body 134, and the magenta light is emitted from the magenta light emitting body 131, white light is generated by the mixture of the emitted light and irradiated to the liquid crystal panel 105.

FIG. 55 is a diagram illustrating the summary of the relationship between the configuration of each of the light emitting bodies 135, 134, and 131 illustrated in FIG. 54 and the color of output light. As illustrated in FIG. 55, the yellow light emitting body 135 serving as a first light emitting body emits the yellow light, the cyan light emitting body 134 serving as a second light emitting body emits the cyan light, and the magenta light emitting body 131 serving as a third light emitting body emits the magenta light.

Figure 56:
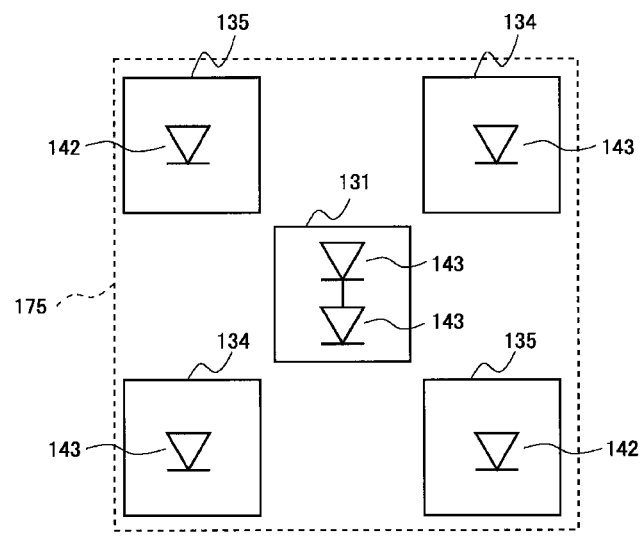
FIG. 56 is a diagram illustrating an arrangement of respective light emitting bodies in a cluster, and a number of green and blue LED elements implemented in respective light emitting bodies according to a tenth embodiment.

FIG. 56 is a diagram illustrating an arrangement of respective light emitting bodies 135, 134, and 131 in the cluster 175, and the number of LED elements 142 and 143 implemented in respective light emitting bodies 135, 134, and 131. As illustrated in FIG. 56, two yellow light emitting bodies 135 and two cyan light emitting bodies 134 are arranged in the cluster 175, and one magenta light emitting body 131 is arranged in the cluster 175. One green LED element 142 is implemented in a package of each of two yellow light emitting bodies 135, one blue LED element 143 is implemented in a package of each of two cyan light emitting bodies 134, and two blue LED elements 143 are implemented in a package of the magenta light emitting body 131. The shape of the cluster 175 is a square shape with substantially the same lengths in horizontal and vertical directions, and two yellow light emitting bodies 135 and two cyan light emitting bodies 134 are arranged in different diagonal directions so that the light emitting bodies of the same color are not adjacent to each other around the circumference in the cluster 175. The magenta light emitting body 131 is arranged in the center of the cluster 175 which is an area surrounded by the yellow and cyan light emitting bodies.

Figure 57:
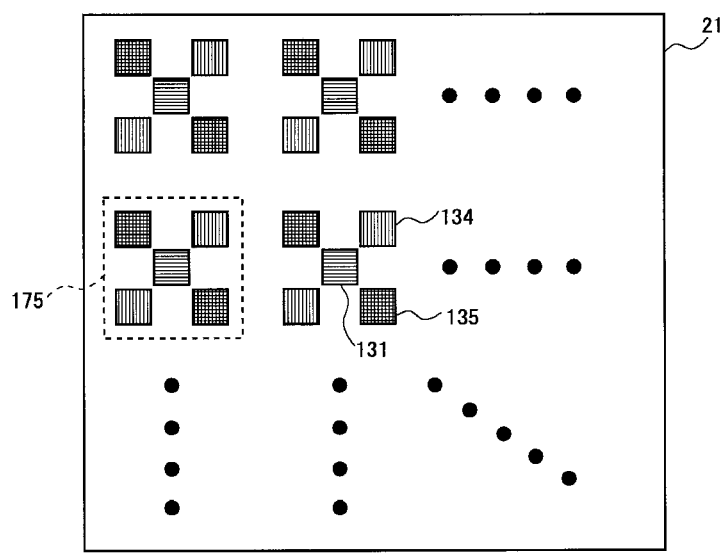
FIG. 57 is a diagram illustrating an arrangement of clusters on the LED substrate of the tenth embodiment.
Figure 61:
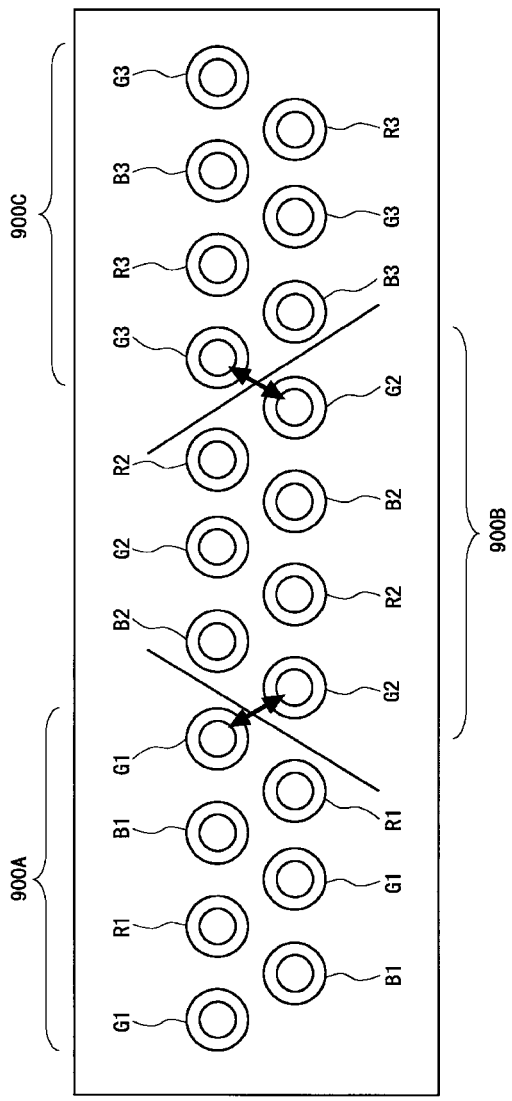
FIG. 61 is a diagram illustrating an arrangement of light emitting bodies of respective colors in a backlight device in the related art.
Figure 62:
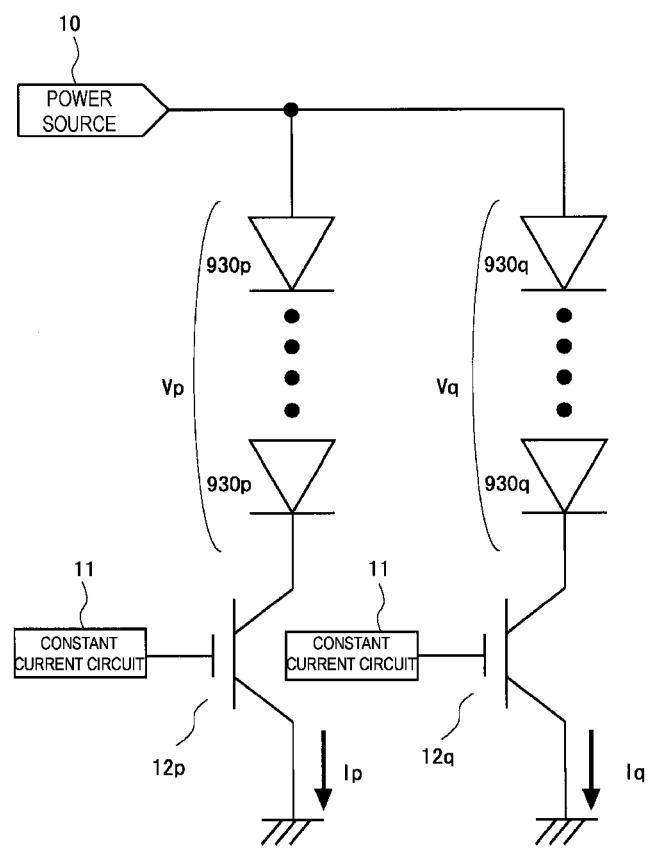
FIG. 62 is a block diagram illustrating a configuration of a drive voltage applying circuit which applies drive voltage to first light emitting bodies and second light emitting bodies in a backlight device in the related art.

FIG. 57 is a diagram illustrating arrangement of clusters 175 on the LED substrate 21 of the present embodiment. As illustrated in FIG. 57, respective clusters 175 are arranged regularly. Therefore, each yellow light emitting body 135 of each cluster 175 is adjacent to the cyan light emitting bodies 134 of neighboring clusters 175, and each cyan light emitting body 134 is adjacent to the yellow light emitting bodies 135 of neighboring clusters 175. With this configuration, as neither the yellow light or the cyan light is emphasized, occurrence of color unevenness can be suppressed. Furthermore, since the shape of each cluster 175 is a substantial square with high symmetry, the color unevenness of an image displayed on the liquid crystal panel 105 is suppressed in any direction.

11.2 Effect

According to the present embodiment, power consumption of the yellow light emitting bodies 135 and the magenta light emitting body 131 is substantially equal to the power consumption of the cyan light emitting bodies 134, and therefore power loss does not occur in the yellow light emitting bodies 135 and the magenta light emitting body 131. Furthermore, the color unevenness of an image displayed on the liquid crystal panel 105 is suppressed in any direction.

12. Quantum Dot

For light emitting bodies used as a light source of a backlight device, improvement of color reproducibility is required. As such, quantum dot is attracting attention as an optical wavelength conversion material for a light emitting body. A quantum dot is a small grain formed in order to confine electrons. The size of one grain of a quantum dot is several nanometers to several tens of nanometers in diameter, and a quantum dot comprises about 10000 atoms. When excitation light is incident upon such a quantum dot, the quantum dot is excited and emits fluorescence with a wavelength different from the wavelength of the excitation light. By using quantum dots having such luminescence characteristics, the light emitting bodies emitting magenta, cyan, and yellow light described in the above-described embodiments can be manufactured. By appropriately combining these light emitters and arranging them on the LED substrate 21, it is possible to irradiate the liquid crystal panel 105 with white light. Since the half-width of the fluorescence emitted from the quantum dot is narrow, it is excellent for color reproducibility.

Therefore, in each of above-described embodiments, using quantum dots which emit red or green light by converting the wavelength of the excitation light, a portion of the light emitted from the green LED element 142 or the blue LED element 143 may be converted into red light or green light. Accordingly, in the present specification, phosphors such as the red phosphors 151 and green phosphors 152 and quantum dots may be collectively referred to as an "optical wavelength conversion materials". In particular, phosphors and quantum dots which convert to red light may be referred to as "red wavelength conversion materials", and phosphors and quantum dots which convert to green light may be referred to as a "green wavelength conversion materials".

13. Light Source of Backlight Device

Above-described embodiments illustrate examples using the LED elements as the light source of the backlight device 100. However, the light source of the backlight device 100 is not limited to the LED elements, and semiconductor laser elements may be used, for example. Therefore, herein, light sources such as an "LED elements" and a "semiconductor laser elements" may be referred to as "light emitting elements". For example, the "blue LED element" is referred to as a "blue light emitting element", and the "green LED element" is referred to as a "green light emitting element".

14. Summary of First to Tenth Embodiments

FIGS. 58 to 60 are diagrams illustrating the summary of the above-described first to tenth embodiments. More specifically, FIG. 58 is a diagram illustrating the summary of the first to fourth embodiments, FIG. 59 is a diagram illustrating the summary of the fifth to eighth embodiments, and FIG. 60 is a diagram illustrating the summary of the ninth and tenth embodiments. As illustrated in FIG. 58 to FIG. 60, for the first to third light emitting bodies which form the cluster in each embodiment, the colors emitted by the implemented light emitting elements, the type of optical wavelength conversion materials which convert a wavelength of light emitted by the light emitting elements, the color of the light output from the light emitting bodies, the number of light emitting bodies, and the number of light emitting elements included in one light emitting body were described. Cases in which the colors of the light output from the first to third light emitting bodies are the same, but the number of light emitting bodies included in the cluster or the number of light emitting elements included in one light emitting body are different from the embodiment are described as modifications. Features of the above-described embodiments are summarized as follows.

Light emitted by the first light emitting body includes red light. The red light is generated by a red wavelength conversion material. A light emitting element in the first light emitting body may be a blue light emitting element or a green light emitting element.

Light emitted by the second light emitting body includes green light. The green light may be light generated by a green wavelength conversion material or light generated by a green light emitting element. The second light emitting body may further emit red light by a red wavelength conversion material when the green light is generated by the green light emitting element.

Light emitted by the third light emitting body includes blue light. The blue light may be generated by a blue light emitting element. The third light emitting body may further emit green light by a green wavelength conversion material or may emit red light by a red wavelength conversion material.

INDUSTRIAL APPLICABILITY

The present invention is applied to a backlight device irradiating light emitted from LEDs as backlight to a display panel such as a liquid crystal display device.

REFERENCE SIGNS LIST

21 LED substrate
100 Backlight device
105 Liquid crystal panel
110 Backlight driving circuit
161 to 175 Cluster
131 Magenta light emitting body (First light emitting body)
132 Green light emitting body (Second light emitting body)
133 Blue light emitting body (Third light emitting body)
134 Cyan light emitting body (Second light emitting body)
142 Green LED element (Green light emitting element)
143 Blue LED element (Blue light emitting element)
151 Red phosphor
152 Green phosphor 200 Display control circuit
300 Source driver (Image signal line driving circuit)
400 Gate driver (Scanning signal line driving circuit)
500 Display unit

The invention claimed is:

1. A backlight device using light emitting diode elements as a light source, the backlight device comprising:
a substrate with a plurality of sets of clusters arranged in the backlight device, each cluster including at least one first light emitting body configured to emit light of a first color, one second light emitting body configured to emit light of a second color, and one third light emitting body configured to emit light of a third color; and
a drive voltage applying circuit configured to apply drive voltage of the same value to the first light emitting body, the second light emitting body, and the third light emitting body,
wherein the first light emitting body includes either a blue light emitting element or a green light emitting element, and a red wavelength conversion material excited by light emitted from either the blue light emitting element or the green light emitting element to emit red light,
the second light emitting body includes either a green light emitting element, or a blue light emitting element and a green wavelength conversion material excited by light emitted from the blue light emitting element to emit green light,
the third light emitting body includes a blue light emitting element,
a total number of the first light emitting body, the second light emitting body, and the third light emitting body included in each cluster is four to six, a number of blue light emitting elements or green light emitting elements included in the first light emitting body or first light emitting bodies, a number of green light emitting elements or blue light emitting elements included in the second light emitting body or second light emitting bodies, and a number of blue light emitting elements included in the third light emitting body or third light emitting bodies is two.

2. The backlight device according to claim 1, wherein
the first light emitting body is a magenta light emitting body configured to emit magenta light and includes the blue light emitting element and the red wavelength conversion material,
the second light emitting body is a green light emitting body configured to emit green light and includes the green light emitting element,
the third light emitting body is a blue light emitting body configured to emit blue light,
the total number of three kinds of light emitting bodies including the first light emitting body, the second light emitting body, and the third light emitting body arranged in the cluster is five, any one kind of the light emitting body among the three kinds includes one light emitting body in which two corresponding light emitting elements are implemented, the other two kinds of light emitting bodies each includes two light emitting bodies in each of which one light emitting element corresponding to each light emitting body is implemented,
the light emitting body in which the two light emitting elements are implemented is arranged in the center of the cluster, and the light emitting bodies in each of which one light emitting element is implemented are arranged so that the light emitting bodies surround the light emitting body in which two light emitting elements are implemented and the same kind of light emitting bodies are not adjacent to each other.

3. The backlight device according to claim 2, wherein
the light emitting body in which the two light emitting elements are implemented is the blue light emitting body in which two blue light emitting elements are implemented,
the light emitting bodies in each of which one light emitting element is implemented includes two magenta light emitting bodies in each of which one blue light emitting element is implemented, and two green light emitting bodies in each of which one green light emitting element is implemented, and
the blue light emitting body is arranged in the center of the cluster, and the magenta light emitting bodies and the green light emitting bodies are arranged so that the light emitting bodies surround the blue light emitting body and the same kind of light emitting bodies are not adjacent to each other in the cluster.

4. The backlight device according to claim 1, wherein
the first light emitting body is a magenta light emitting body configured to emit magenta light and includes the blue light emitting element and the red wavelength conversion material,
the second light emitting body is a green light emitting body configured to emit green light and includes the green light emitting element,
the third light emitting body is a blue light emitting body configured to emit blue light,
the total number of three kinds of light emitting bodies including the first light emitting body, the second light emitting body, and the third light emitting body arranged in the cluster is four, any one kind of light emitting body among the three kinds includes two light emitting bodies in each of which one corresponding light emitting element is implemented, the other two kinds of light emitting bodies each includes one light emitting body in which two light emitting elements corresponding to each light emitting body are implemented, and
the first light emitting body, the second light emitting body, and the third light emitting body are arranged in the cluster such that the same kind of light emitting bodies are not adjacent to each other.

5. The backlight device according to claim 4, wherein
the one kind of light emitting body is the two magenta light emitting bodies in each of which one blue light emitting element is implemented,
the two kinds of light emitting bodies include one green light emitting body in which two green light emitting elements are implemented and one blue light emitting body in which two blue light emitting elements are implemented, and
the first light emitting bodies, the second light emitting body, and the third light emitting body are arranged in the cluster such that the same kind of light emitting bodies are not adjacent to each other.

6. The backlight device according to claim 4, wherein
the one kind of light emitting body is the two green light emitting bodies in each of which one green light emitting element is implemented,
the two kinds of light emitting bodies include one magenta light emitting body in which two blue light emitting elements are implemented and one blue light emitting body in which two blue light emitting elements are implemented, and the first light emitting bodies, the second light emitting body, and the third light emitting body are arranged in the cluster so that the same kind of light emitting bodies are not adjacent to each other.

7. The backlight device according to claim 1, wherein
the first light emitting body is a magenta light emitting body configured to emit magenta light and includes the blue light emitting element and the red wavelength conversion material,
the second light emitting body is a green light emitting body configured to emit green light and includes the green light emitting element,
the third light emitting body is a blue light emitting body configured to emit blue light,
two first light emitting bodies, two second light emitting bodies, and two third light emitting bodies are arranged in the cluster, and each of the first light emitting bodies, the second light emitting bodies, and the third light emitting bodies are a light emitting body in which one light emitting element corresponding to each light emitting body is implemented.

8. The backlight device according to claim 1, wherein
the first light emitting body is a magenta light emitting body configured to emit magenta light and includes the blue light emitting element and the red wavelength conversion material,
the second light emitting body is a cyan light emitting body configured to emit cyan light and includes the blue light emitting element and the green wavelength conversion material,
the third light emitting body is a blue light emitting body configured to emit blue light,
the total number of three kinds of light emitting bodies including the first light emitting body, the second light emitting body, and the third light emitting body arranged in the cluster is five, any one kind of the light emitting body among the three kinds includes one light emitting body in which two corresponding light emitting elements are implemented, the other two kinds of light emitting bodies each includes two light emitting bodies in which one light emitting element corresponding to each light emitting body is implemented,
the light emitting body in which the two light emitting elements are implemented is arranged in the center of the cluster, and the light emitting bodies in each of which one light emitting element is implemented are arranged such that the light emitting bodies surround the light emitting body in which two light emitting elements are implemented and the same kind of light emitting bodies are not adjacent to each other.

9. The backlight device according to claim 1, wherein
the first light emitting body is a magenta light emitting body configured to emit magenta light and includes the blue color emitting element and the red wavelength conversion material,
the second light emitting body is a cyan light emitting body configured to emit cyan light and includes the blue light emitting element and the green wavelength conversion material,
the third light emitting body is a blue light emitting body configured to emit blue light,
the total number of three kinds of light emitting bodies including the first light emitting body, the second light emitting body, and the third light emitting body arranged in the cluster is four, any one kind of the light emitting body among the three kinds includes two light emitting bodies in each of which one light emitting elements corresponding to the light emitting body is implemented, the other two kinds of light emitting bodies each includes one light emitting body in which two light emitting elements corresponding to each light emitting body are implemented, and
the first light emitting body, the second light emitting body, and the third light emitting body are arranged in the cluster such that the same kind of light emitting bodies are not adjacent to each other.

10. The backlight device according to claim 1, wherein
the first light emitting body is a magenta light emitting body configured to emit magenta light and includes the blue light emitting element and the red wavelength conversion material,
the second light emitting body is a green light emitting body configured to emit green light and includes the green light emitting element and emitting green light,
the third light emitting body is a cyan light emitting body configured to emit cyan light and further includes a green wavelength conversion material excited by light emitted from the blue light emitting element to emit green light,
the total number of three kinds of light emitting bodies including the first light emitting body, the second light emitting body, and the third light emitting body arranged in the cluster is five, any one kind of the light emitting body among the three kinds includes two light emitting bodies in each of which one light emitting element corresponding to the light emitting body is implemented, the other two kinds of light emitting bodies each includes two light emitting bodies in each of which one light emitting element corresponding to each light emitting body is implemented,
the light emitting body in which the two light emitting elements are implemented is arranged in the center of the cluster, and the light emitting bodies in each of which one light emitting element is implemented are arranged such that the light emitting bodies surround the light emitting body in which the two light emitting elements are implemented and the same kind of light emitting bodies are not adjacent to each other.

11. The backlight device according to claim 1, wherein
the first light emitting body is a magenta light emitting body configured to emit magenta light and includes the blue light emitting element and the red wavelength conversion material,
the second light emitting body is a green light emitting body configured to emit green light and includes the green light emitting element,
the third light emitting body is a cyan light emitting body configured to emit cyan light and further includes a green wavelength conversion material excited by light emitted from the blue light emitting element to emit green light,
the total number of three kinds of light emitting bodies including the first light emitting body, the second light emitting body, and the third light emitting body arranged in the cluster is four, any one kind of the light emitting body among the three kinds includes two light emitting bodies in each of which one corresponding light emitting elements is implemented, the other two kinds of light emitting bodies each includes one light emitting body in which two light emitting elements corresponding to each light emitting body are implemented, and
the first light emitting body, the second light emitting body, and the third light emitting body are arranged in the cluster such that the same kind of light emitting bodies are not adjacent to each other.

12. The backlight device according to claim 1, wherein the first light emitting body is a magenta light emitting body configured to emit magenta light and includes the blue light emitting element and the red wavelength conversion material.

13. The backlight device according to claim 12, wherein the second light emitting body is a yellow light emitting body configured to emit yellow light and includes the green light emitting element and a red wavelength conversion material excited by light emitted from the green light emitting element to emit red light.

14. The backlight device according to claim 1, wherein the first light emitting body is a yellow light emitting body configured to emit yellow light and includes the green light emitting element and a red wavelength conversion material excited by light emitted from the green light emitting element to emit red light.

15. The backlight device according to claim 14, wherein the third light emitting body is a magenta light emitting body configured to emit magenta light and further includes a red wavelength conversion material excited by light emitted from the blue light emitting element to emit red light.

16. The backlight device according to claim 1, wherein
the total number of three kinds of light emitting bodies including the first light emitting body, the second light emitting body, and the third light emitting body arranged in the cluster is five, any one kind of the light emitting body among the three kinds includes two light emitting bodies in each of which one corresponding light emitting elements is implemented, the other two kinds of light emitting bodies each includes two light emitting bodies in each of which one light emitting element corresponding to each light emitting body is implemented, the light emitting body in which the two light emitting elements are implemented is arranged in the center of the cluster, and the light emitting bodies in each of which one light emitting element is implemented are arranged such that the light emitting bodies surround the light emitting body in which the two light emitting elements are implemented and the same kind of light emitting bodies are not adjacent to each other.

17. The backlight device according to claim 1, wherein
the total number of three kinds of light emitting bodies including the first light emitting body, the second light emitting body, and the third light emitting body arranged in the cluster is four, any one kind of the light emitting body among the three kinds includes two light emitting bodies in each of which one corresponding light emitting element is implemented, the other two kinds of light emitting bodies each includes one light emitting body in which one light emitting element corresponding to each light emitting body is implemented, and the first light emitting body, the second light emitting body, and the third light emitting body are arranged in the cluster such that the same kind of light emitting bodies are not adjacent to each other.

18. The backlight device according to claim 1, wherein
two first light emitting bodies, two second light emitting bodies, and two third light emitting bodies are arranged in the cluster, each of the first light emitting bodies, the second light emitting bodies, and the third light emitting bodies is a light emitting body in which one corresponding light emitting element is implemented.

19. A liquid crystal display device comprising:
a liquid crystal panel including a display unit configured to display an image;
the backlight device according to claim 1 configured to irradiate light to a rear surface of the liquid crystal panel; and
a drive voltage applying circuit configured to apply drive voltage of the same value to the first light emitting body, the second light emitting body, and the third light emitting body,
the liquid crystal display device further comprising a backlight driving circuit configured to drive the backlight device.

\* \* \* \* \*